(12) United States Patent
Shinsho

(10) Patent No.: US 10,636,786 B2
(45) Date of Patent: Apr. 28, 2020

(54) SEMICONDUCTOR DEVICE

(71) Applicant: ROHM CO., LTD., Kyoto-shi, Kyoto (JP)

(72) Inventor: Kohei Shinsho, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/878,863

(22) Filed: Jan. 24, 2018

(65) Prior Publication Data

US 2018/0226400 A1    Aug. 9, 2018

(30) Foreign Application Priority Data

Jan. 26, 2017   (JP) .................................. 2017-012264

(51) Int. Cl.
*H01L 27/06* (2006.01)
*H01L 29/06* (2006.01)
(Continued)

(52) U.S. Cl.
CPC ...... *H01L 27/0664* (2013.01); *H01L 27/0727* (2013.01); *H01L 29/0619* (2013.01);
(Continued)

(58) Field of Classification Search
CPC ............. H01L 27/0664; H01L 29/7396; H01L 29/0834; H01L 29/0661; H01L 29/0638;
(Continued)

(56) References Cited

U.S. PATENT DOCUMENTS

| 10,170,606 B2 * | 1/2019 | Shinsho ............ H01L 29/66348 |
| 2007/0200138 A1 * | 8/2007 | Ozeki ................. H01L 27/0611 |
| | | 257/139 |

(Continued)

FOREIGN PATENT DOCUMENTS

JP         2010263215 A       11/2010

*Primary Examiner* — Bitew A Dinke
(74) *Attorney, Agent, or Firm* — Hamre, Schumann, Mueller & Larson, P.C.

(57) ABSTRACT

A semiconductor device includes a semiconductor layer of a first conductivity type having a first principal surface on one side and a second principal surface on the other side, the semiconductor layer in which a device formation region and an outer region outside the device formation region are set, a channel region of a second conductivity type formed in a surface layer portion of the first principal surface of the semiconductor layer in the device formation region, an emitter region of a first conductivity type formed in a surface layer portion of the channel region, a gate electrode formed at the first principal surface of the semiconductor layer in the device formation region, the gate electrode facing the channel region across a gate insulating film, a collector region of a second conductivity type formed in a surface layer portion of the second principal surface of the semiconductor layer in the device formation region, an inner cathode region of a first conductivity type formed in the surface layer portion of the second principal surface of the semiconductor layer in the device formation region, and an outer cathode region of a first conductivity type formed in the surface layer portion of the second principal surface of the semiconductor layer in the outer region.

23 Claims, 17 Drawing Sheets

(51) Int. Cl.
*H01L 29/861* (2006.01)
*H01L 29/40* (2006.01)
*H01L 29/739* (2006.01)
*H01L 27/07* (2006.01)
*H01L 29/08* (2006.01)
*H01L 29/10* (2006.01)

(52) U.S. Cl.
CPC ...... *H01L 29/0623* (2013.01); *H01L 29/0638* (2013.01); *H01L 29/0661* (2013.01); *H01L 29/0834* (2013.01); *H01L 29/404* (2013.01); *H01L 29/7395* (2013.01); *H01L 29/7396* (2013.01); *H01L 29/7397* (2013.01); *H01L 29/861* (2013.01); *H01L 29/1095* (2013.01)

(58) Field of Classification Search
CPC ............. H01L 29/0619; H01L 29/7397; H01L 27/0727; H01L 29/404; H01L 29/7395; H01L 29/861; H01L 29/0623; H01L 29/1095
See application file for complete search history.

(56) References Cited

U.S. PATENT DOCUMENTS

| | | | |
|---|---|---|---|
| 2009/0242931 A1* | 10/2009 | Tsuzuki | H01L 29/167 257/143 |
| 2010/0140658 A1* | 6/2010 | Koyama | H01L 27/0664 257/140 |
| 2010/0156506 A1* | 6/2010 | Tsuzuki | H01L 27/0664 327/478 |
| 2010/0224907 A1* | 9/2010 | Hara | H01L 29/0657 257/139 |
| 2010/0276727 A1 | 11/2010 | Storasta et al. | |
| 2010/0308370 A1* | 12/2010 | Hshieh | H01L 29/0619 257/136 |
| 2011/0079870 A1* | 4/2011 | Senoo | H01L 29/402 257/504 |
| 2011/0291223 A1* | 12/2011 | Nakamura | H01L 29/0657 257/493 |
| 2013/0341673 A1* | 12/2013 | Pfirsch | H01L 29/404 257/139 |
| 2015/0014741 A1* | 1/2015 | Chen | H01L 29/7397 257/139 |
| 2015/0279931 A1* | 10/2015 | Chen | H01L 29/7395 257/495 |
| 2015/0325691 A1* | 11/2015 | Miyakoshi | H01L 29/42372 257/329 |
| 2016/0005844 A1* | 1/2016 | Kimura | H01L 29/7397 257/140 |
| 2016/0056306 A1* | 2/2016 | Masuoka | H01L 29/0692 257/483 |
| 2016/0254375 A1* | 9/2016 | Nakamura | H01L 29/404 257/144 |
| 2016/0260703 A1* | 9/2016 | Nakamura | H01L 29/404 |
| 2016/0300936 A1* | 10/2016 | Ogawa | H01L 29/868 |
| 2017/0062336 A1* | 3/2017 | Takahashi | H01L 27/11582 |
| 2017/0263603 A1* | 9/2017 | Hata | H01L 29/7397 |
| 2017/0263785 A1* | 9/2017 | Masuoka | H01L 29/868 |
| 2017/0294526 A1* | 10/2017 | Storasta | H01L 29/7395 |
| 2018/0076193 A1* | 3/2018 | Shirakawa | H01L 29/407 |
| 2018/0182844 A1* | 6/2018 | Nakamura | H01L 21/26513 |
| 2018/0248003 A1* | 8/2018 | Nakamura | |
| 2019/0019885 A1* | 1/2019 | Naito | H01L 27/0635 |

\* cited by examiner

SEMICONDUCTOR DEVICE

BACKGROUND OF THE INVENTION

1. Field of the Invention

The present invention relates to a semiconductor device.

2. Description of the Related Art

FIG. 2 of US2010276727A1 discloses an RC-IGBT (Reverse Conducting-Insulated Gate Bipolar Transistor) serving as an example of a semiconductor device.

The RC-IGBT includes a semiconductor layer. A p type channel region is formed in a surface layer portion of a front surface of the semiconductor layer. An n type emitter region is formed in a surface layer portion of the channel region. A gate electrode electrically connected to the channel region across an insulating film is formed at the front surface of the semiconductor layer. A p type connector region and plural n type cathode regions are formed in a region of a surface layer portion of a rear surface of the semiconductor layer, the region facing the channel region.

SUMMARY OF THE INVENTION

One preferred embodiment of the present invention provides a semiconductor device that includes a semiconductor layer of a first conductivity type having a first principal surface on one side and a second principal surface on the other side, the semiconductor layer in which a device formation region and an outer region outside the device formation region are set, a channel region of a second conductivity type formed in a surface layer portion of the first principal surface of the semiconductor layer in the device formation region, an emitter region of a first conductivity type formed in a surface layer portion of the channel region, a gate electrode formed at the first principal surface of the semiconductor layer in the device formation region, the gate electrode facing the channel region across a gate insulating film, a collector region of a second conductivity type formed in a surface layer portion of the second principal surface of the semiconductor layer in the device formation region, an inner cathode region of a first conductivity type formed in the surface layer portion of the second principal surface of the semiconductor layer in the device formation region, and an outer cathode region of a first conductivity type formed in the surface layer portion of the second principal surface of the semiconductor layer in the outer region.

One preferred embodiment of the present invention provides a semiconductor layer of a first conductivity type having a first principal surface on one side and a second principal surface on the other side, a channel region of a second conductivity type formed in a surface layer portion of the first principal surface of the semiconductor layer, an emitter region of a first conductivity type formed in a surface layer portion of the channel region, a gate electrode formed at the first principal surface of the semiconductor layer, the gate electrode facing the channel region across a gate insulating film, a collector region of a second conductivity type formed in a facing region facing the channel region in a surface layer portion of the second principal surface of the semiconductor layer, an inner cathode region of a first conductivity type formed in the facing region in the surface layer portion of the second principal surface of the semiconductor layer, and an outer cathode region of a first conductivity type formed in a non-facing region which is a region outside the facing region in the surface layer portion of the second principal surface of the semiconductor layer.

The above and other objects, features, and effects of the present invention will be made clear by the following description of the preferred embodiments with reference to the accompanying drawings.

DETAILED DESCRIPTION OF THE PREFERRED EMBODIMENTS

Figure 1:
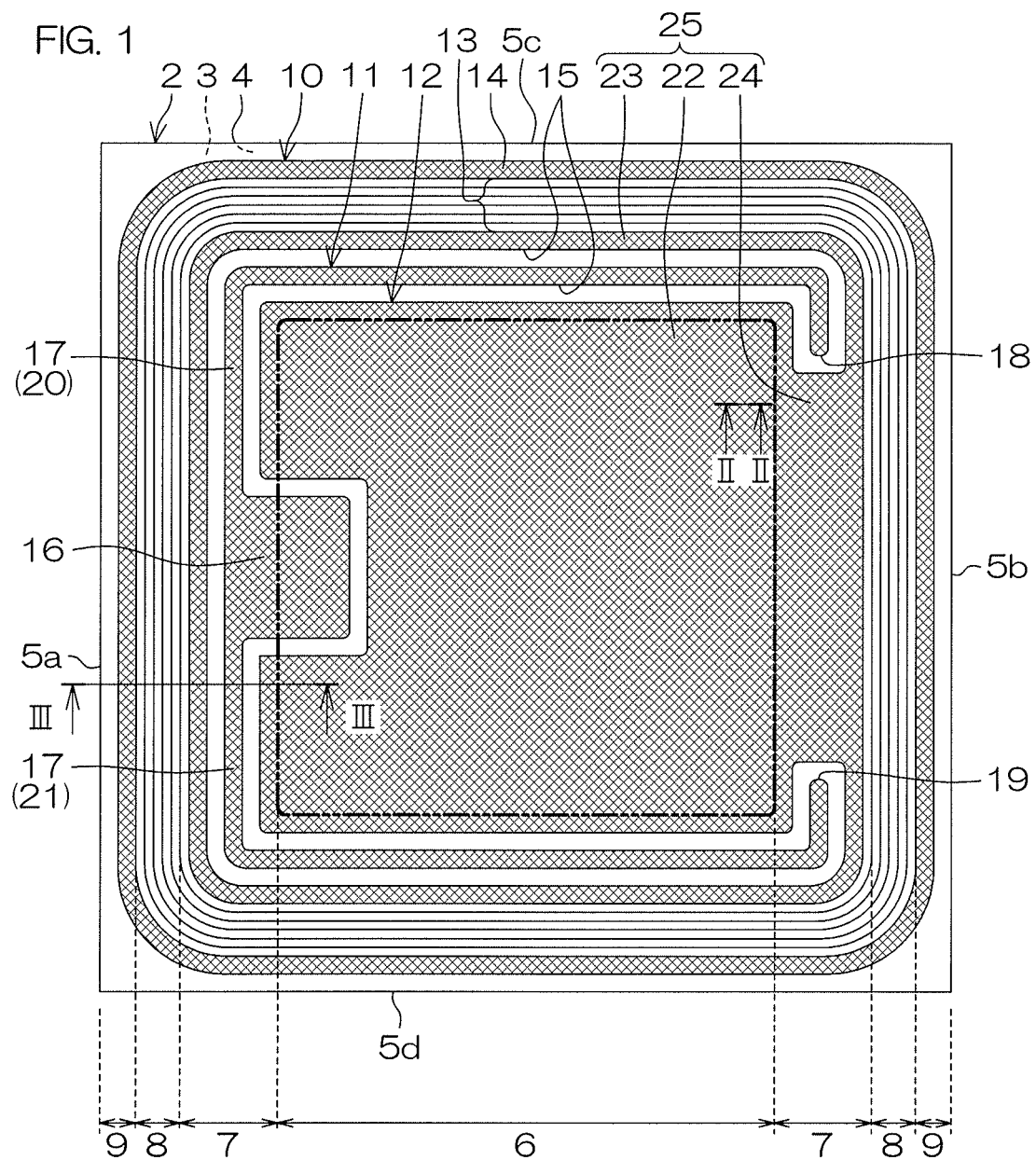
FIG. 1 is a top view of a semiconductor device according to a first preferred embodiment of the present invention.

With the semiconductor device according to US2010276727A1, when a predetermined forward voltage is applied between the emitter region and the collector region in a state where a predetermined voltage is applied between the gate electrode and the emitter region, it is sometimes difficult for a forward current to flow between the emitter region and the collector region.

Therefore, in order to obtain a relatively high forward current, a relatively high forward voltage has to be applied. As a result, the forward voltage is deteriorated. The deterioration of the forward voltage can result in a snap-back phenomenon.

Thus, a preferred embodiment of the present invention provides a semiconductor device with which deterioration of a forward voltage can be suppressed.

One preferred embodiment of the present invention provides a semiconductor device that includes a semiconductor layer of a first conductivity type having a first principal surface on one side and a second principal surface on the other side, the semiconductor layer in which a device formation region and an outer region outside the device formation region are set, a channel region of a second conductivity type formed in a surface layer portion of the first principal surface of the semiconductor layer in the device formation region, an emitter region of a first conductivity type formed in a surface layer portion of the channel region, a gate electrode formed at the first principal surface of the semiconductor layer in the device formation region, the gate electrode facing the channel region across a gate insulating film, a collector region of a second conductivity type formed in a surface layer portion of the second principal surface of the semiconductor layer in the device formation region, an inner cathode region of a first conductivity type formed in the surface layer portion of the second principal surface of the semiconductor layer in the device formation region, and an outer cathode region of a first conductivity type formed in the surface layer portion of the second principal surface of the semiconductor layer in the outer region.

With this semiconductor device, even when a predetermined forward voltage is applied between the emitter region and the collector region in a state where a predetermined voltage is applied between the gate electrode and the emitter region, difficulty of a forward current in flowing between the emitter region and the collector region can be suppressed. Therefore, the deterioration of the forward voltage can be suppressed. Thus, a snap-back phenomenon due to the deterioration of the forward voltage can be suppressed.

One preferred embodiment of the present invention provides a semiconductor device that includes a semiconductor layer of a first conductivity type having a first principal surface on one side and a second principal surface on the other side, a channel region of a second conductivity type formed in a surface layer portion of the first principal surface of the semiconductor layer, an emitter region of a first conductivity type formed in a surface layer portion of the channel region, a gate electrode formed at the first principal surface of the semiconductor layer, the gate electrode facing the channel region across a gate insulating film, a collector region of a second conductivity type formed in a facing region facing the channel region in a surface layer portion of the second principal surface of the semiconductor layer, an inner cathode region of a first conductivity type formed in the facing region in the surface layer portion of the second principal surface of the semiconductor layer, and an outer cathode region of a first conductivity type formed in a non-facing region which is a region outside the facing region in the surface layer portion of the second principal surface of the semiconductor layer.

With this semiconductor device, even when a predetermined forward voltage is applied between the emitter region and the collector region in a state where a predetermined voltage is applied between the gate electrode and the emitter region, difficulty of a forward current in flowing between the emitter region and the collector region can be suppressed. Therefore, the deterioration of the forward voltage can be suppressed. Thus, a snap-back phenomenon due to the deterioration of the forward voltage can be suppressed.

The preferred embodiments of the present invention shall now be described in detail with reference to the attached drawings.

FIG. 1 is a top view of a semiconductor device 1 according to a first preferred embodiment of the present invention.

With reference to FIG. 1, the semiconductor device 1 includes a semiconductor layer 2 formed in a chip shape. The semiconductor layer 2 includes a first principal surface 3 on one side, a second principal surface 4 on the other side, and four side surfaces 5a, 5b, 5c, 5d connecting the first principal surface 3 and the second principal surface 4.

The first principal surface 3 and the second principal surface 4 are formed in a square shape in a plan view as viewed from a normal direction of the first principal surface 3 of the semiconductor layer 2 (hereinafter, simply referred to as "in the plan view"). The side surface 5a and the side surface 5b face each other. The side surface 5c and the side surface 5d face each other. A device formation region 6, an outer region 7, a withstand voltage retention region 8, and a scribe region 9 are set in the semiconductor layer 2. The device formation region 6 is also called the active region.

The device formation region 6 is a region where an IGBT (Insulated Gate Bipolar Transistor) is formed. The device formation region 6 is set to be spaced from a peripheral edge of the semiconductor layer 2 to an inner region of the semiconductor layer 2.

The device formation region 6 is set in a central region of the semiconductor layer 2 in the plan view. The device formation region 6 is set in a square shape having four sides parallel to the side surfaces 5a to 5d of the semiconductor layer 2 in the plan view.

The outer region 7 is set in a region on the outside of the device formation region 6. The outer region 7 is a region partitioning the device formation region 6 from the other region (withstand voltage retention region 8). The outer region 7 is set in a region between the peripheral edge of the semiconductor layer 2 and a peripheral edge of the device formation region 6. The outer region 7 is set in an endless shape (square ring shape) surrounding the device formation region 6 in the plan view.

The withstand voltage retention region 8 is set in a region on the outside of the outer region 7. The withstand voltage retention region 8 is a region for improving withstand voltage of the semiconductor device 1. The withstand voltage retention region 8 is set in a region between the peripheral edge of the semiconductor layer 2 and a peripheral edge of the outer region 7. The withstand voltage retention region 8 is set in an endless shape (square ring shape) surrounding the outer region 7 in the plan view.

The scribe region 9 is set in a region on the outside of the withstand voltage retention region 8. The scribe region 9 is a region where a cutting member such as a dicing blade passes through at the time of manufacturing. The scribe region 9 is set in a region between the peripheral edge of the semiconductor layer 2 and a peripheral edge of the withstand voltage retention region 8. The scribe region 9 is set in an endless shape (square ring shape) surrounding the withstand voltage retention region 8 in the plan view.

A front surface electrode 10 is formed above the first principal surface 3 of the semiconductor layer 2. The front surface electrode 10 includes a gate electrode 11, an emitter electrode 12, field plate electrodes 13, and an equipotential electrode 14. The gate electrode 11, the emitter electrode 12, the field plate electrodes 13, and the equipotential electrode 14 are electrically insulated by an insulating region 15 bordering those electrodes.

The gate electrode 11 is formed in the outer region 7. The gate electrode 11 includes a gate pad 16 and a gate finger 17. The gate pad 16 is formed along a central region of the side surface 5a in the plan view.

In this embodiment, the gate pad 16 is formed in a square shape in the plan view. The gate pad 16 crosses a region of the device formation region 6 and the outer region 7 and is drawn out from the outer region 7 into the device formation region 6.

The gate finger 17 is drawn out in a band shape from the gate pad 16, and partitions the device formation region 6 from three directions in the outer region 7. The gate finger 17 has a pair of open ends 18, 19 on the side surface 5b side. More specifically, the gate finger 17 includes a first gate finger 20 and a second gate finger 21.

The first gate finger 20 is drawn out in a band shape from an end portion of the gate pad 16 on the side surface 5c side. The first gate finger 20 has the open end 18 on the side surface 5b side. The second gate finger 21 is drawn out in a band shape from an end portion of the gate pad 16 on the side surface 5d side. The second gate finger 21 has the open end 19 on the side surface 5b side.

The emitter electrode 12 includes an emitter pad 22, an emitter routing portion 23, and an emitter connecting portion 24.

The emitter pad 22 is formed in a C-shaped region partitioned by a peripheral edge of the gate pad 16 and a peripheral edge of the gate finger 17 in the plan view. The emitter pad 22 is formed in a C shape along the peripheral edge of the gate pad 16 and the peripheral edge of the gate finger 17 in the plan view.

The emitter pad 22 covers the substantially entire device formation region 6. A peripheral edge of the emitter pad 22 crosses the region of the device formation region 6 and the outer region 7 and is drawn out from the device formation region 6 into the outer region 7.

The emitter routing portion 23 is formed in the outer region 7. The emitter routing portion 23 is drawn around in a band shape in a region on the outside of the gate finger 17. In this embodiment, the emitter routing portion 23 is formed in an endless shape (square ring shape) surrounding the gate finger 17 in the plan view. The emitter routing portion 23 may be formed in an ended shape extending in a band shape along the gate finger 17.

The emitter connecting portion 24 crosses a region between the pair of open ends 18, 19 of the gate finger 17 from the emitter pad 22 and is connected to the emitter routing portion 23. The emitter routing portion 23 is electrically connected to the emitter pad 22 via the emitter connecting portion 24.

The IGBT formed in the device formation region 6 structurally includes an npn type parasitic bipolar transistor. When an avalanche current generated in a region outside the device formation region 6 flows into the device formation region 6, the parasitic bipolar transistor is turned on. In this case, control of the IGBT may sometimes become unstable due to a latch-up.

Thus, in this embodiment, an avalanche current absorbing structure 25 that absorbs the avalanche current generated in the region outside the device formation region 6 is formed by the emitter electrode 12 including the emitter pad 22, the emitter routing portion 23, and the emitter connecting portion 24.

In the avalanche current absorbing structure 25, the avalanche current generated in the region outside the device formation region 6 is absorbed by the emitter routing portion 23. The avalanche current is taken out from the emitter pad 22 via the emitter connecting portion 24.

Thereby, turning-on of the parasitic bipolar transistor by an undesired current generated in the region outside the device formation region 6 can be suppressed. Therefore, a latch-up can be suppressed, so that stability of the IGBT can be enhanced.

The field plate electrodes 13 are formed in the withstand voltage retention region 8. In FIG. 1, the field plate electrodes 13 are shown by lines. In this embodiment, the plural (five in this case) field plate electrodes 13 are formed to be spaced from each other from the outer region 7 toward the scribe region 9.

Each of the field plate electrodes 13 is drawn around in a band shape along the emitter routing portion 23. In this embodiment, each of the field plate electrodes 13 is formed in an endless shape (square ring shape) surrounding the emitter routing portion 23 in the plan view. At least one of the plural field plate electrodes 13 may be formed in an ended shape.

The equipotential electrode 14 is formed in the scribe region 9. The equipotential electrode 14 is drawn around in a band shape along the field plate electrodes 13. In this embodiment, the equipotential electrode 14 is formed in an endless shape (square ring shape) surrounding the field plate electrodes 13 in the plan view. Thereby, the equipotential electrode 14 is formed as an EQR (Equi-potential Ring) electrode.

Figure 2:
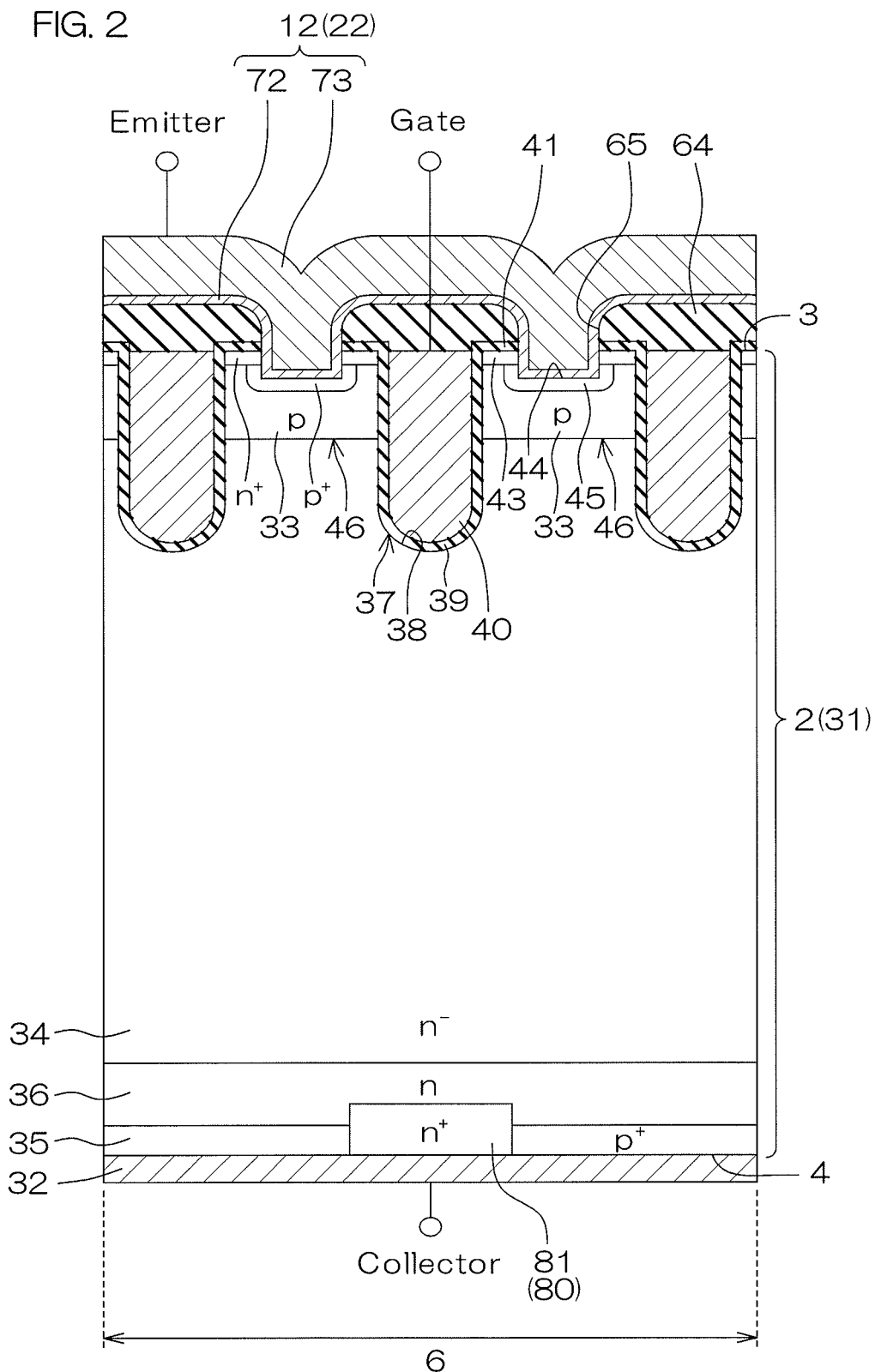
FIG. 2 is a sectional view taken along line II-II shown in FIG. 1.
Figure 3:
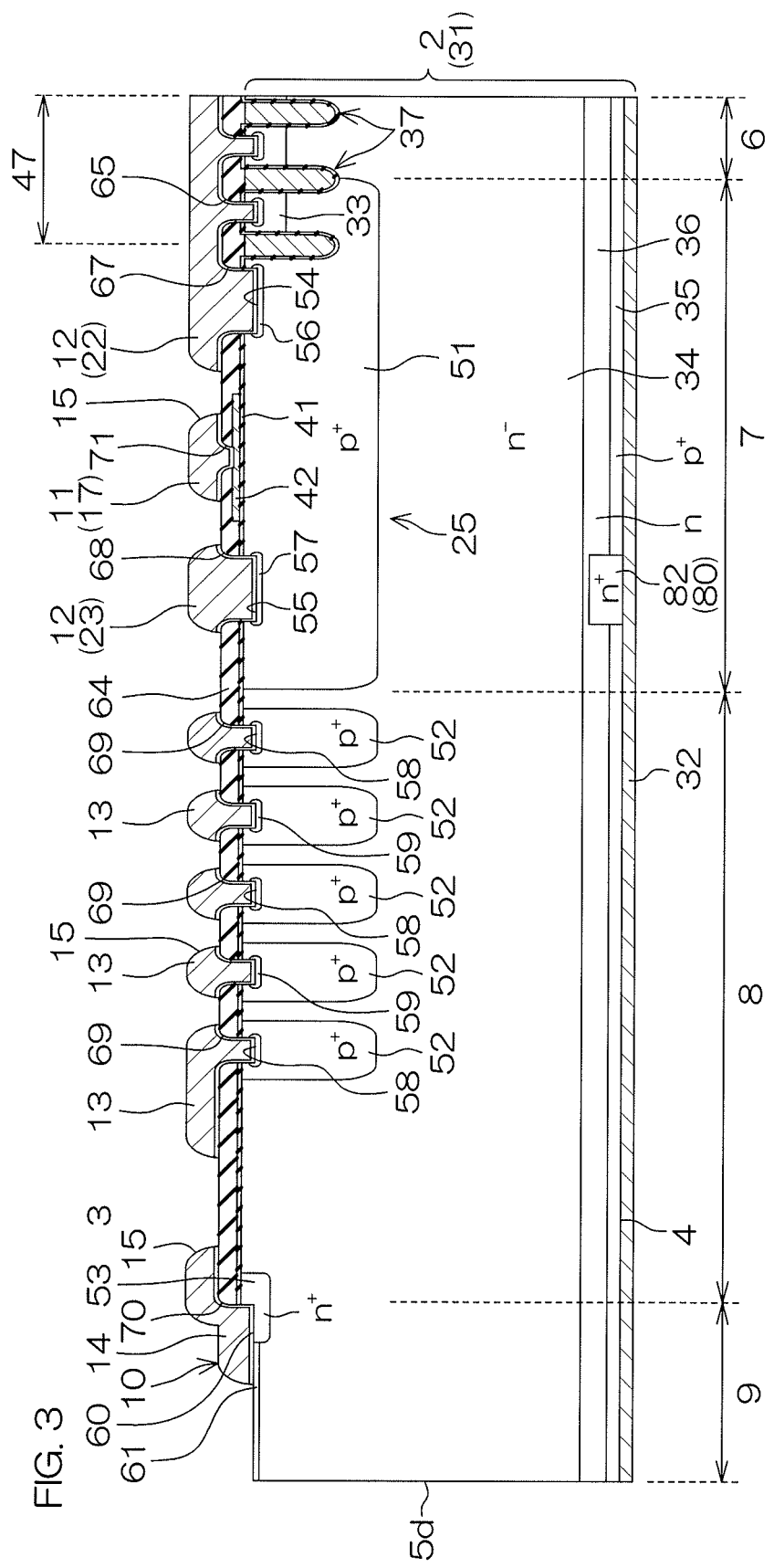
FIG. 3 is a sectional view taken along line shown in FIG. 1.

FIG. 2 is a sectional view taken along line II-II shown in FIG. 1. FIG. 3 is a sectional view taken along line III-III shown in FIG. 1.

With reference to FIGS. 2 and 3, the semiconductor layer 2 has a single layer structure including an $n^-$ type semiconductor substrate 31 in this embodiment. The $n^-$ type semiconductor substrate 31 is made of a silicon FZ substrate formed by the FZ (Floating Zone) method. A collector electrode 32 serving as a rear surface electrode is connected to the second principal surface 4 of the semiconductor layer 2.

In the device formation region 6, in a surface layer portion of the first principal surface 3 of the semiconductor layer 2, a p type channel region 33 is formed. In this embodiment, the p type channel region 33 is formed in a square shape having four sides parallel to the side surfaces 5a to 5d of the semiconductor layer 2 in the plan view. The p type channel region 33 is formed to be spaced from the peripheral edge of the semiconductor layer 2 to the inner region of the semiconductor layer 2. In this embodiment, the device formation region 6 is defined by the p type channel region 33.

In the device formation region 6, in a region on the second principal surface 4 side of the semiconductor layer 2 with respect to the p type channel region 33, an $n^-$ type drift region 34 is formed. The $n^-$ type drift region 34 is electrically connected to the p type channel region 33.

The $n^-$ type drift region 34 is formed by utilizing a part of the $n^-$ type semiconductor substrate 31. The $n^-$ type drift region 34 is formed in the outer region 7, the withstand voltage retention region 8, and the scribe region 9 in addition to the device formation region 6.

In the device formation region 6, in a surface layer portion of the second principal surface 4 of the semiconductor layer 2, a $p^+$ type collector region 35 is formed. The $p^+$ type collector region 35 is electrically connected to the collector electrode 32 on the second principal surface 4 of the semiconductor layer 2. The $p^+$ type collector region 35 is electrically connected to the $n^-$ type drift region 34 in the semiconductor layer 2.

The $p^+$ type collector region 35 is formed in the outer region 7, the withstand voltage retention region 8, and the scribe region 9 in addition to the device formation region 6. In this embodiment, the $p^+$ type collector region 35 is formed over the entire surface layer portion of the second principal surface 4 of the semiconductor layer 2.

The p$^+$ type collector region 35 is formed in a non-facing region not facing the p type channel region 33 in addition to a facing region facing the p type channel region 33 on the second principal surface 4 of the semiconductor layer 2.

In a region between the n$^-$ type drift region 34 and the p$^+$ type collector region 35, an n type buffer region 36 is formed in this embodiment. The n type buffer region 36 is a high-concentration and low-resistant region having an n type impurity concentration higher than an n type impurity concentration of the n$^-$ type drift region 34. The n type buffer region 36 extends in the region between the n$^-$ type drift region 34 and the p$^+$ type collector region 35 along the second principal surface 4 of the semiconductor layer 2.

In this embodiment, the p$^+$ type collector region 35 is electrically connected to the n$^-$ type drift region 34 via the n type buffer region 36. Although not shown in the figures, an n type field stop region may be formed in the region between the n type buffer region 36 and the p$^+$ type collector region 35.

In the device formation region 6, on the first principal surface 3 of the semiconductor layer 2, plural trench gate structures 37 are formed to be spaced from each other. In this embodiment, the plural trench gate structures 37 are formed in a band shape extending along an arbitrary one direction in the plan view. Trench gate structures 37 extending in a grid shape in the plan view may be formed.

Each of the trench gate structures 37 includes a gate trench 38, a gate insulating film 39, and an embedded gate electrode 40.

The gate trench 38 is formed on the first principal surface 3 of the semiconductor layer 2. The gate trench 38 passes through the p type channel region 33, and has a bottom wall positioned in the n$^-$ type drift region 34.

The gate insulating film 39 is formed in a film shape along an inner wall surface of the gate trench 38. One surface (front surface on the semiconductor layer 2 side) and the other surface of the gate insulating film 39 are formed along the inner wall surface of the gate trench 38.

The gate trench 38 may be formed in a square shape having side walls which extend substantially perpendicularly to the first principal surface 3 of the semiconductor layer 2. The gate trench 38 may be formed in a tapered shape whose opening area is larger than a bottom area. The bottom wall of the gate trench 38 may be formed in parallel to the first principal surface 3 of the semiconductor layer 2. The bottom wall of the gate trench 38 may be formed in a projected and curved shape extending outward.

The embedded gate electrode 40 is embedded in the gate trench 38 with the gate insulating film 39 being placed between the electrode and the gate trench. The inner wall surface of the gate trench 38 forms a part of the first principal surface 3 of the semiconductor layer 2. The embedded gate electrode 40 may include at least one of polysilicon, copper, aluminum, or tungsten.

A surface insulating film 41 is formed on the first principal surface 3 of the semiconductor layer 2. The gate insulating film 39 continues to the surface insulating film 41 outside the gate trench 38.

The trench gate structures 37 include a trench gate structure 37 formed in a region of the device formation region 6 close to the outer region 7. The embedded gate electrode 40 of this trench gate structure 37 includes a gate lead portion 42 drawn out from the inside of the gate trench 38 toward the outer region 7.

The gate lead portion 42 is drawn out to a region immediately below the gate pad 16 (not shown) and/or a region immediately below the gate finger 17. FIG. 3 shows an example in which the gate lead portion 42 is drawn out to the region immediately below the gate finger 17.

The gate lead portion 42 is electrically connected to the gate pad 16 and the gate finger 17. Thereby, the embedded gate electrode 40 is electrically connected to the gate electrode 11 via the gate lead portion 42.

On the side of each of the trench gate structures 37, an n$^+$ type emitter region 43 is formed in a surface layer portion of the p type channel region 33. The n$^+$ type emitter region 43 is exposed from the first principal surface 3 of the semiconductor layer 2.

On the side of each of the trench gate structures 37, the n$^+$ type emitter region 43, the p type channel region 33, and the n$^-$ type drift region 34 are formed in this order from the first principal surface 3 of the semiconductor layer 2 toward the second principal surface 4.

In a region between the adjacently-placed trench gate structures 37, a first contact recessed portion 44 for the emitter pad 22 is formed in the surface layer portion of the p type channel region 33. The first contact recessed portion 44 extends in a band shape along the trench gate structures 37. In a case where the trench gate structures 37 formed in a grid shape in the plan view are formed, the first contact recessed portion 44 may be formed in a region surrounded by the trench gate structures 37.

The first contact recessed portion 44 is formed by digging into the first principal surface 3 of the semiconductor layer 2. The first contact recessed portion 44 is shallower than the gate trench 38. A bottom wall of the first contact recessed portion 44 is positioned in the p type channel region 33. The p type channel region 33 is exposed from a side wall and the bottom wall of the first contact recessed portion 44. The n$^+$ type emitter region 43 is exposed from the side wall of the first contact recessed portion 44.

In this embodiment, the p type channel region 33 includes a p$^+$ type contact region 45 whose p type impurity concentration is higher than that of the other region. The p$^+$ type contact region 45 is formed in a region of the p type channel region 33 along the bottom wall of the first contact recessed portion 44.

The p$^+$ type contact region 45 is formed along the side wall of the first contact recessed portion 44. The p$^+$ type contact region 45 is also formed along corner portions connecting the bottom wall and the side wall of the first contact recessed portion 44. The p$^+$ type contact region 45 may be formed along only the bottom wall of the first contact recessed portion 44.

The p type channel region 33 is shared by the adjacently-placed trench gate structures 37. The embedded gate electrode 40 faces the n$^+$ type emitter region 43, the p type channel region 33, and the n$^-$ type drift region 34 across the gate insulating film 39.

An IGBT channel structure 46 is formed by the trench gate structures 37, the n$^+$ type emitter region 43, the p type channel region 33, and the n$^-$ type drift region 34. An IGBT channel is formed in a region of the p type channel region 33 between the n$^+$ type emitter region 43 and the n$^-$ type drift region 34.

A dummy channel structure 47 is formed in the device formation region 6 and the region of the outer region 7 in the device formation region 6. The dummy channel structure 47 has a structure similar to the channel structure 46 except the point in which the n$^+$ type emitter region 43 is not included. In the dummy channel structure 47, no IGBT channel is formed.

In the region of the device formation region 6 and the outer region 7, an electric current in the device formation region 6 and an electric current outside the device formation region 6 are merged. Thus, there is a tendency in which current density becomes relatively high. In the IGBT channel structure 46, structurally, the npn type parasitic bipolar transistor described above is formed.

Therefore, when the IGBT channel structure 46 is formed in the region of the device formation region 6 and the outer region 7, the npn type parasitic bipolar transistor is turned on to possibly cause a latch-up.

Meanwhile, the dummy channel structure 47 does not include any n$^+$ type emitter region 43. Thus, structurally, no npn type parasitic bipolar transistor is formed. Therefore, a latch-up due to the parasitic bipolar transistor can be suppressed by the dummy channel structure 47.

In the outer region 7, a p$^+$ type terminal region 51 is formed in the surface layer portion of the first principal surface 3 of the semiconductor layer 2. The p$^+$ type terminal region 51 defines the outer region 7. The device formation region 6 is also defined by a region surrounded by an inner peripheral edge of the p$^+$ type terminal region 51.

The p$^+$ type terminal region 51 is a high-concentration and low-resistant region having a p type impurity concentration higher than a p type impurity concentration of the p type channel region 33. In this embodiment, the p$^+$ type terminal region 51 is formed in an endless shape (square ring shape) surrounding the p type channel region 33 in the plan view.

A bottom portion of the p$^+$ type terminal region 51 is positioned in the second principal surface 4 side of the semiconductor layer 2 with respect to a bottom portion of the p type channel region 33 regarding the thickness direction of the semiconductor layer 2. The bottom portion of the p$^+$ type terminal region 51 is positioned in the second principal surface 4 side of the semiconductor layer 2 with respect to the bottom wall of the gate trench 38 regarding the thickness direction of the semiconductor layer 2. The bottom portion of the p$^+$ type terminal region 51 is positioned in the first principal surface 3 side of the semiconductor layer 2 with respect to the p$^+$ type collector region 35.

An inner edge region of the p$^+$ type terminal region 51 positioned in the p type channel region 33 side overlaps the bottom wall of the gate trench 38 of the dummy channel structure 47. The inner edge region of the p$^+$ type terminal region 51 may overlap the bottom portion of the p type channel region 33.

The p$^+$ type terminal region 51 faces the p$^+$ type collector region 35 across a part of the n$^-$ type drift region 34. The p$^+$ type terminal region 51 faces the gate pad 16 and/or the gate finger 17 across the surface insulating film 41. The p$^+$ type terminal region 51 faces the gate lead portion 42 across the surface insulating film 41.

In the withstand voltage retention region 8, p$^+$ type field limit regions 52 are formed in the surface layer portion of the first principal surface 3 of the semiconductor layer 2. The p$^+$ type field limit regions 52 relax the electric field in the withstand voltage retention region 8.

The p$^+$ type field limit regions 52 have a p type impurity concentration substantially equal to the p type impurity concentration of the p$^+$ type terminal region 51. The p$^+$ type field limit regions 52 have a depth substantially equal to a depth of the p$^+$ type terminal region 51.

The p$^+$ type field limit regions 52 are formed in a region between the outer region 7 and the scribe region 9 along the p$^+$ type terminal region 51. In this embodiment, the p$^+$ type field limit regions 52 are formed in an endless shape (square ring shape) surrounding the p$^+$ type terminal region 51 in the plan view. Thereby, the p$^+$ type field limit regions 52 are formed as FLR (Field Limiting Ring) regions.

In this embodiment, the p$^+$ type field limit regions 52 include plural (five in this embodiment) p$^+$ type field limit regions 52 formed to be spaced from each other in this order from the outer region 7 toward the scribe region 9. At least one p$^+$ type field limit region 52 may be formed. Five or more p$^+$ type field limit regions 52 may be formed.

In the scribe region 9, an n$^+$ type channel stop region 53 is formed in the surface layer portion of the first principal surface 3 of the semiconductor layer 2. The n$^+$ type channel stop region 53 is a high-concentration and low-resistant region having an n type impurity concentration higher than the n type impurity concentration of the n$^-$ type drift region 34. The n$^+$ type channel stop region 53 suppresses spread of a depletion layer from a pn junction portion formed in the inner region of the semiconductor layer 2.

The n$^+$ type channel stop region 53 is formed along the p$^+$ type field limit regions 52. The n$^+$ type channel stop region 53 is formed in an endless shape (square ring shape) surrounding the p$^+$ type field limit regions 52 in the plan view. The n$^+$ type channel stop region 53 may cross a region between the withstand voltage retention region 8 and the scribe region 9.

In the outer region 7, a second contact recessed portion 54 for the emitter pad 22 and a third contact recessed portion 55 for the emitter routing portion 23 are formed in a surface layer portion of the p$^+$ type terminal region 51.

The second contact recessed portion 54 is formed at the first principal surface 3 of the semiconductor layer 2. The second contact recessed portion 54 is formed along an inner edge of the p$^+$ type terminal region 51. The second contact recessed portion 54 is formed in an endless shape (square ring shape) surrounding the device formation region 6 in the plan view.

The second contact recessed portion 54 has a bottom wall positioned in the p$^+$ type terminal region 51. The second contact recessed portion 54 has a depth substantially equal to a depth of the first contact recessed portion 44.

The third contact recessed portion 55 is formed on the first principal surface 3 of the semiconductor layer 2. The third contact recessed portion 55 is formed along an outer edge of the p$^+$ type terminal region 51. The third contact recessed portion 55 is formed in an endless shape (square ring shape) surrounding the device formation region 6 in the plan view.

The third contact recessed portion 55 has a bottom wall positioned in the p$^+$ type terminal region 51. The third contact recessed portion 55 has a depth substantially equal to the depth of the first contact recessed portion 44.

The p$^+$ type terminal region 51 includes a p$^+$ type contact region 56 formed in a region along the bottom wall of the second contact recessed portion 54. The p$^+$ type contact region 56 is a high-concentration region having a p type impurity concentration higher than those of the other regions in the p$^+$ type terminal region 51.

The p$^+$ type contact region 56 is also formed along a side wall of the second contact recessed portion 54. The p$^+$ type contact region 56 is also formed along corner portions connecting the bottom wall and the side wall of the second contact recessed portion 54. The p$^+$ type contact region 56 may be formed along only the bottom wall of the second contact recessed portion 54.

The p$^+$ type terminal region 51 includes a p$^+$ type contact region 57 formed in a region along the bottom wall of the third contact recessed portion 55. The p$^+$ type contact region 57 is a high-concentration region having a p type impurity concentration higher than those of the other regions in the p$^+$ type terminal region 51.

The p$^+$ type contact region 57 is also formed along a side wall of the third contact recessed portion 55. The p$^+$ type contact region 57 is also formed along corner portions connecting the bottom wall and the side wall of the third contact recessed portion 55. The p$^+$ type contact region 57 may be formed along only the bottom wall of the third contact recessed portion 55.

In the withstand voltage retention region 8, a fourth contact recessed portion 58 for each of the field plate electrodes 13 is formed in a surface layer portion of each of the p$^+$ type field limit regions 52.

The fourth contact recessed portions 58 are formed at the first principal surface 3 of the semiconductor layer 2. The fourth contact recessed portions 58 are formed along the p$^+$ type field limit regions 52. The fourth contact recessed portions 58 are formed in an endless shape (square ring shape) surrounding the device formation region 6 in the plan view.

Each of the fourth contact recessed portions 58 has a bottom wall positioned in each of the p$^+$ type field limit regions 52. The fourth contact recessed portions 58 have a depth substantially equal to the depth of the first contact recessed portion 44.

Each of the p$^+$ type field limit regions 52 includes a p$^+$ type contact region 59 formed in a region along a bottom wall of each of the fourth contact recessed portions 58. Each of the p$^+$ type contact regions 59 is a high-concentration region having a p type impurity concentration higher than those of the other regions in each of the p$^+$ type field limit regions 52.

Each of the p$^+$ type contact regions 59 is formed along, in addition to the bottom wall of the fourth contact recessed portion 58, the side wall of the fourth contact recessed portion 58, and corner portions connecting the bottom wall and the side wall of the fourth contact recessed portions 58. Each of the p$^+$ type contact regions 59 may be formed along only the bottom wall of the fourth contact recessed portion 58.

In the scribe region 9, a fifth contact recessed portion 60 for the equipotential electrode 14 is formed in the surface layer portion of the first principal surface 3 of the semiconductor layer 2.

The fifth contact recessed portion 60 is formed by digging into the first principal surface 3 of the semiconductor layer 2. The fifth contact recessed portion 60 is formed along the n$^+$ type channel stop region 53. The fifth contact recessed portion 60 is formed in an endless shape (square ring shape) surrounding the withstand voltage retention region 8 in the plan view.

The fifth contact recessed portion 60 has a depth substantially equal to the depth of the first contact recessed portion 44. The n$^+$ type channel stop region 53 is exposed from the fifth contact recessed portion 60.

In the semiconductor layer 2, a p$^+$ type contact region 61 is formed in a region along a bottom wall of the fifth contact recessed portion 60. The p$^+$ type contact region 61 may be formed along a side wall of the fifth contact recessed portion 60.

The p$^+$ type contact region 61 may be formed along corner portions connecting the bottom wall and the side wall of the fifth contact recessed portion 60. The p$^+$ type contact region 61 may be formed along only the bottom wall of the fifth contact recessed portion 60.

An insulating layer 64 is formed on the first principal surface 3 of the semiconductor layer 2. The insulating layer 64 covers the device formation region 6, the outer region 7, the withstand voltage retention region 8, and the scribe region 9. The insulating layer 64 may have a laminated structure in which plural insulating films are laminated. The insulating layer 64 may have a single layer structure including a single insulating layer. The insulating layer 64 may include an oxide film (SiO$_2$ film) or a nitride film (SiN film).

First contact holes 65, a second contact hole 67, and a third contact hole 68 are formed in the insulating layer 64. The first contact holes 65, the second contact hole 67, and the third contact hole 68 are respectively formed for the emitter electrode 12.

The first contact holes 65, the second contact hole 67, and the third contact hole 68 are respectively flush with and communicate with the first contact recessed portions 44, the second contact recessed portion 54, and the third contact recessed portion 55 in a one-to-one relationship.

Fourth contact holes 69 for the field plate electrodes 13 are formed in the insulating layer 64. The fourth contact holes 69 are flush with and communicate with the fourth contact recessed portions 58.

A fifth contact hole 70 for the equipotential electrode 14 is formed in the insulating layer 64. The fifth contact hole 70 is flush with and communicates with the fifth contact recessed portion 60.

A gate contact hole 71 for the gate electrode 11 is formed in the insulating layer 64. From the gate contact hole 71, the gate lead portion 42 is exposed in the region immediately below the gate pad 16 and/or the region immediately below the gate finger 17. FIG. 3 shows an example in which the gate contact hole 71 is formed in the region immediately below the gate finger 17.

The front surface electrode 10 is formed on the insulating layer 64. The front surface electrode 10 has a laminated structure including a first conductor layer 72 formed on the insulating layer 64 and a second conductor layer 73 formed on the first conductor layer 72.

One surface (front surface on the semiconductor layer 2 side) and the other surface of the first conductor layer 72 are formed along a front surface of the insulating layer 64 and a front surface of the semiconductor layer 2. One surface (front surface on the semiconductor layer 2 side) and the other surface of the second conductor layer 73 are formed along the first conductor layer 72.

The first conductor layer 72 may have a single layer structure including a titanium nitride layer or a titanium layer. The first conductor layer 72 may have a laminated structure including a titanium nitride layer and a titanium layer formed on the titanium nitride layer. The first conductor layer 72 functions as a barrier electrode layer by including the titanium nitride layer and/or the titanium layer.

The second conductor layer 73 may include at least one of copper, aluminum, an alloy including copper, or an alloy including aluminum. The second conductor layer 73 may include an aluminum-copper alloy (Al—Cu alloy). The second conductor layer 73 may include an aluminum-silicon-copper alloy (Al—Si—Cu alloy).

The gate pad 16 and/or the gate finger 17 come into the gate contact hole 71 from above the insulating layer 64. The gate pad 16 and/or the gate finger 17 are electrically connected to the gate lead portion 42 in the gate contact hole 71.

The emitter pad 22 comes into the first contact holes 65 and the second contact hole 67 from above the insulating layer 64. The emitter pad 22 is electrically connected to the p type channel region 33 and the n$^+$ type emitter region 43 in the first contact holes 65. The emitter pad 22 is electrically connected to the p$^+$ type terminal region 51 in the second contact hole 67.

The emitter routing portion 23 comes into the third contact hole 68 from above the insulating layer 64. The emitter routing portion 23 is electrically connected to the p$^+$ type terminal region 51 in the third contact hole 68. Although not shown in the figures, the emitter connecting portion 24 may come into the second contact hole 67.

In the semiconductor layer 2, the avalanche current flowing in the region outside the device formation region 6 is absorbed by the emitter electrode 12 via the p$^+$ type terminal region 51. Therefore, the avalanche current absorbing structure 25 further includes, in addition to the emitter pad 22, the emitter routing portion 23, and the emitter connecting portion 24, the p$^+$ type terminal region 51 electrically connected to these.

The field plate electrodes 13 come into the fourth contact holes 69 from above the insulating layer 64. The field plate electrodes 13 are electrically connected to the p$^+$ type field limit regions 52 in the fourth contact holes 69.

The equipotential electrode 14 comes into the fifth contact hole 70 from above the insulating layer 64. The equipotential electrode 14 is electrically connected to the n$^+$ type channel stop region 53 in the fifth contact hole 70.

Figure 4:
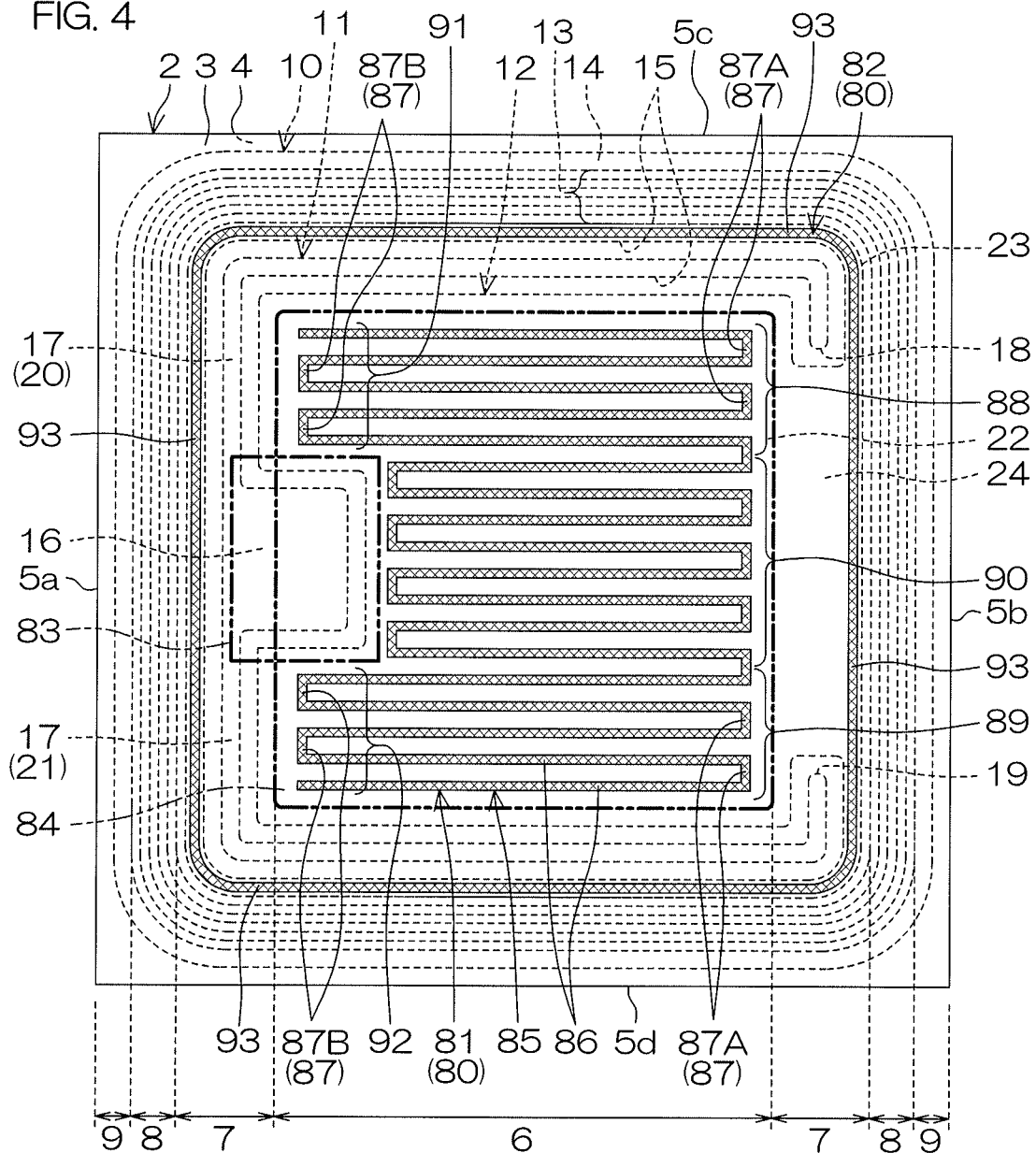
FIG. 4 is a plan view for explaining a structure on the second principal surface side of a semiconductor layer shown in FIG. 1.

FIG. 4 is a plan view for explaining a structure on the second principal surface 4 side of the semiconductor layer 2 shown in FIG. 1.

With reference to FIG. 4, an n$^+$ type cathode region 80 is formed in the surface layer portion of the second principal surface 4 of the semiconductor layer 2. In FIG. 4, the n$^+$ type cathode region 80 is shown by cross-hatching. With reference to FIGS. 2 to 4, the n$^+$ type cathode region 80 is formed by selectively introducing n type impurities to the second principal surface 4 of the semiconductor layer 2 (p$^+$ type collector region 35).

The n$^+$ type cathode region 80 has an n type impurity concentration higher than an n type impurity concentration of the semiconductor layer 2. The n$^+$ type cathode region 80 is a region containing n type impurities and p type impurities, in which the n type impurity concentration of the n type impurities is higher than a p type impurity concentration of the p type impurities.

The n$^+$ type cathode region 80 includes an n$^+$ type inner cathode region 81 and an n$^+$ type outer cathode region 82. The n$^+$ type inner cathode region 81 is formed in the device formation region 6. The n$^+$ type outer cathode region 82 is formed in the outer region 7.

The n$^+$ type inner cathode region 81 and the n$^+$ type outer cathode region 82 are formed through an n type impurity implantation process utilizing the same ion implantation mask. The n$^+$ type outer cathode region 82 has a depth substantially equal to a depth of the n$^+$ type inner cathode region 81. The n$^+$ type outer cathode region 82 has an n type impurity concentration substantially equal to an n type impurity concentration of the n$^+$ type inner cathode region 81.

The n$^+$ type inner cathode region 81 and the n$^+$ type outer cathode region 82 may be formed through an n type impurity implantation process utilizing different ion implantation masks. The n$^+$ type outer cathode region 82 may be formed with the depth different from the depth of the n$^+$ type inner cathode region 81. The n$^+$ type outer cathode region 82 may be formed with an n type impurity concentration different from the n type impurity concentration of the n$^+$ type inner cathode region 81.

On the second principal surface 4 of the semiconductor layer 2, a free space region 83 (see the region surrounded by a double chain line) and a cathode formation region 84 are set in the device formation region 6. The free space region 83 is a region where the n$^+$ type inner cathode region 81 is not formed. The cathode formation region 84 is a region where the n$^+$ type inner cathode region 81 is formed.

In this embodiment, the free space region 83 is set in a region overlapping the gate pad 16 in the plan view. The free space region 83 may enclose a region where the gate pad 16 overlaps the device formation region 6 in the plan view. The free space region 83 may be set in a square shape in the plan view.

The cathode formation region 84 is set in a region overlapping the emitter pad 22 in the plan view. In this embodiment, the cathode formation region 84 is set in a C shape in a region outside the free space region 83 in the plan view.

The n$^+$ type outer cathode region 82 is formed in the inner region from the dummy channel structure 47 in the cathode formation region 84. The n$^+$ type outer cathode region 82 is preferably not formed in a region immediately below the dummy channel structure 47.

With this structure, in the vicinity of the region of the device formation region 6 and the outer region 7, an electric current path passing through the n$^+$ type outer cathode region 82 is not formed. Therefore, in the region of the device formation region 6 and the outer region 7, an increase in an undesired current and an undesired electric field concentration due to the increase in the current can be suppressed. As a matter of course, a structure in which the n$^+$ type outer cathode region 82 is formed in the region immediately below the dummy channel structure 47 may be adopted.

Since the n$^+$ type inner cathode region 81 is not formed in the free space region 83, a pattern becomes non-uniform in the device formation region 6. More specifically, the n$^+$ type inner cathode region 81 is formed in a non-uniform pattern which is at least non-symmetric with respect to a point in the device formation region 6.

The n$^+$ type inner cathode region 81 may be formed in a non-uniform pattern which is non-symmetric with respect to a line in the device formation region 6. The n$^+$ type inner cathode region 81 may be formed in a non-uniform pattern which is non-symmetric with respect to a point and with respect to a line in the device formation region 6.

Hereinafter, the +X direction, the −X direction, the +Y direction, and the −Y direction shown in FIG. 4 may be used for convenience of description. The +X direction and the −X direction are two directions oriented along the pair of side surfaces 5c, 5d and will be simplified as the "X direction" when being referred to collectively. The +Y direction and the −Y direction are two directions oriented along the pair of side surfaces 5a, 5b and will be simplified as the "Y direction" when being referred to collectively.

In this embodiment, the n$^+$ type inner cathode region 81 includes a line-shaped pattern portion 85 of a meandering form drawn around so as to continuously extend in the cathode formation region 84 in the plan view. The line-shaped pattern portion 85 includes plural first lines 86 and plural second lines 87.

The plural first lines 86 extend along the X direction and are spaced from each other along the Y direction. The plural second lines 87 extend along the Y direction and connect the first lines 86 adjacent to each other in the Y direction.

The plural first lines 86 include a first line group 88, a second line group 89, and a third line group 90. The first line group 88 includes the plural first lines 86 formed in a region on the +Y direction side from the free space region 83 in the device formation region 6. The second line group 89 includes the plural first lines 86 formed in a region on the −Y direction side from the free space region 83 in the device formation region 6.

The third line group 90 includes the plural first lines 86 formed in a region between the first line group 88 and the second line group 89 in the device formation region 6. The third line group 90 is formed in a region on the +X direction side from the free space region 83.

In this embodiment, an X direction length of the second line group 89 is substantially equal to an X direction length of the first line group 88. The X direction length of the second line group 89 may be set as a value different from the X direction length of the first line group 88. An X direction length of the third line group 90 is set as a value smaller than the X direction length of the first line group 88 and the X direction length of the second line group 89.

The first line group 88 includes a first line drawing out portion 91 drawn out to a region on the +Y direction side from the free space region 83 so as to face the free space region 83 in the Y direction. The second line group 89 includes a second line drawing out portion 92 drawn out to a region on the −Y direction side from the free space region 83 so as to face the first line group 88 in the Y direction across the free space region 83.

The second lines 87 include second lines 87A and second lines 87B. Each of the second lines 87A connects +X direction end portions of two first lines 86 adjacent to each other in the Y direction. Each of the second lines 87B connects −X direction end portions of two first lines 86 adjacent to each other in the Y direction. The second lines 87A and the second lines 87B are formed one after the other along the Y direction.

A line width of the $n^+$ type inner cathode region 81 may be not less than 1 µm and not more than 100 µm. The line width of the $n^+$ type inner cathode region 81 may be not less than 10 µm and not more than 50 µm. The line width of the $n^+$ type inner cathode region 81 is defined by a Y direction width of the first lines 86 and an X direction width of the second lines 87.

The line width of the $n^+$ type inner cathode region 81 may be uniform or non-uniform. The $n^+$ type inner cathode region 81 may include plural first lines 86 having respectively different Y direction widths. The $n^+$ type inner cathode region 81 may include plural second lines 87 having respectively different X direction widths.

A ratio SB/SA of a planar area SB of the free space region 83 with respect to a planar area SA of the device formation region 6 may be not less than 0.03 (3%) and not more than 0.3 (30%). A ratio SC/SA of a planar area SC of the $n^+$ type inner cathode region 81 with respect to the planar area SA of the device formation region 6 is set as a value smaller than a ratio SD/SA of a planar area SD of the $p^+$ type collector region 35 with respect to the planar area SA of the device formation region 6.

Hereinafter, the ratio SC/SA will be referred to as area ratio SC/SA of the $n^+$ type inner cathode region 81. The ratio SD/SA will be referred to as area ratio SD/SA of the $p^+$ type collector region 35. The area ratio SC/SA of the $n^+$ type inner cathode region 81 may be not more than 0.1 (10%). The area ratio SC/SA of the $n^+$ type inner cathode region 81 may be not less than 0.01 (1%) and not more than 0.07 (7%).

With reference to FIG. 4, the $n^+$ type outer cathode region 82 is formed in the outer region 7. The $n^+$ type outer cathode region 82 is formed along a periphery of the device formation region 6 in the outer region 7. The $n^+$ type outer cathode region 82 is formed in the non-facing region outside the facing region to face the p type channel region 33 in the surface layer portion of the second principal surface 4 of the semiconductor layer 2.

In this embodiment, the $n^+$ type outer cathode region 82 includes line-shaped pattern portions 93 drawn around so as to continuously extend along the periphery of the device formation region 6. The $n^+$ type outer cathode region 82 has a structure in which the four line-shaped pattern portions 93 formed along four sides of the device formation region 6 are integrated. Thereby, the $n^+$ type outer cathode region 82 is formed in an endless shape (square ring shape) surrounding the device formation region 6 in the plan view.

With reference to FIG. 3 again, the $n^+$ type outer cathode region 82 is formed to pass through the $p^+$ type collector region 35 in the outer region 7. The $n^+$ type outer cathode region 82 is electrically connected to a region of the semiconductor layer 2 (in this embodiment, to the $n^-$ type drift region 34 and the n type buffer region 36).

The $n^+$ type outer cathode region 82 faces the $p^+$ type terminal region 51 across a region of the semiconductor layer 2 (in this embodiment, to the $n^-$ type drift region 34 and the n type buffer region 36). In this embodiment, the entire $n^+$ type outer cathode region 82 faces the $p^+$ type terminal region 51.

A line width of the $n^+$ type outer cathode region 82 may be not less than 1 µm and not more than 100 µm. The line width of the $n^+$ type outer cathode region 82 may be not less than 10 µm and not more than 50 µm. The line width of the $n^+$ type outer cathode region 82 is a width in the direction orthogonal to the direction in which the $n^+$ type outer cathode region 82 extends.

Figure 5:
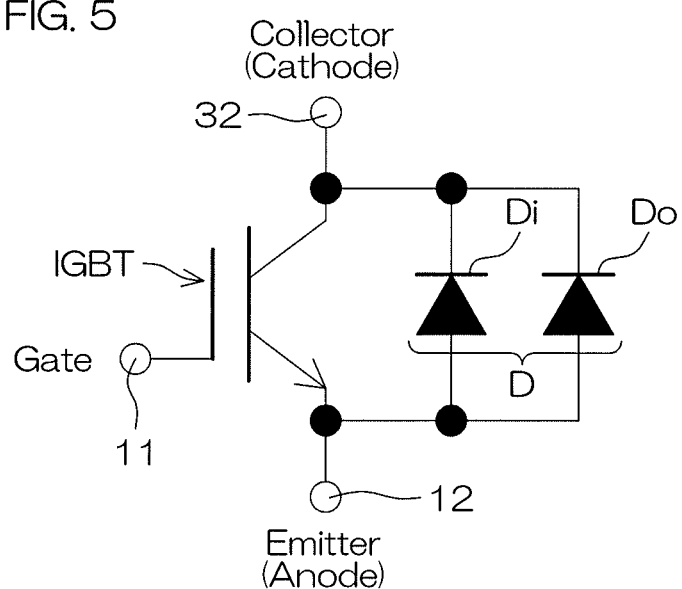
FIG. 5 is a circuit diagram showing an electrical structure of the semiconductor device shown in FIG. 1.

Next, an electrical structure of the semiconductor device 1 will be described. FIG. 5 is a circuit diagram showing the electrical structure of the semiconductor device 1 shown in FIG. 1.

With reference to FIG. 5, the semiconductor device 1 includes the IGBT and a free wheeling diode D. An RC-IGBT (a Reverse Conducting-Insulated Gate Bipolar Transistor) is formed by the IGBT and the free wheeling diode D.

The IGBT includes the gate electrode 11, the emitter electrode 12, and the collector electrode 32. The freewheeling diode D is connected between the emitter electrode 12 and the collector electrode 32.

The free wheeling diode D includes an anode and a cathode. The anode of the free wheeling diode D is electrically connected to the emitter electrode 12 of the IGBT. The cathode of the free wheeling diode D is electrically connected to the collector electrode 32 of the IGBT.

In this embodiment, the free wheeling diode D includes an inner free wheeling diode Di and an outer free wheeling diode Do.

The inner free wheeling diode Di includes a pn junction portion formed in a region between the p type channel region 33 and the $n^-$ type drift region 34 in the device formation region 6. The inner free wheeling diode Di includes the $n^+$ type inner cathode region 81 as the cathode and the p type channel region 33 as the anode.

An anode electrode of the inner free wheeling diode Di is formed mainly by the emitter pad 22 of the emitter electrode 12. A cathode electrode of the inner free wheeling diode Di is formed by the collector electrode 32 connected to the $n^+$ type inner cathode region 81.

The outer free wheeling diode Do includes a pn junction portion formed in a region between the $p^+$ type terminal region 51 and the n⁻ type drift region 34 in the outer region 7. The outer free wheeling diode Do includes the n⁺ type outer cathode region 82 as the cathode and the p⁺ type terminal region 51 as the anode.

An anode electrode of the outer freewheeling diode Do is formed mainly by the emitter routing portion 23 of the emitter electrode 12. A cathode electrode of the outer free wheeling diode Do is formed by the collector electrode 32 connected to the n⁺ type outer cathode region 82.

Figure 6:
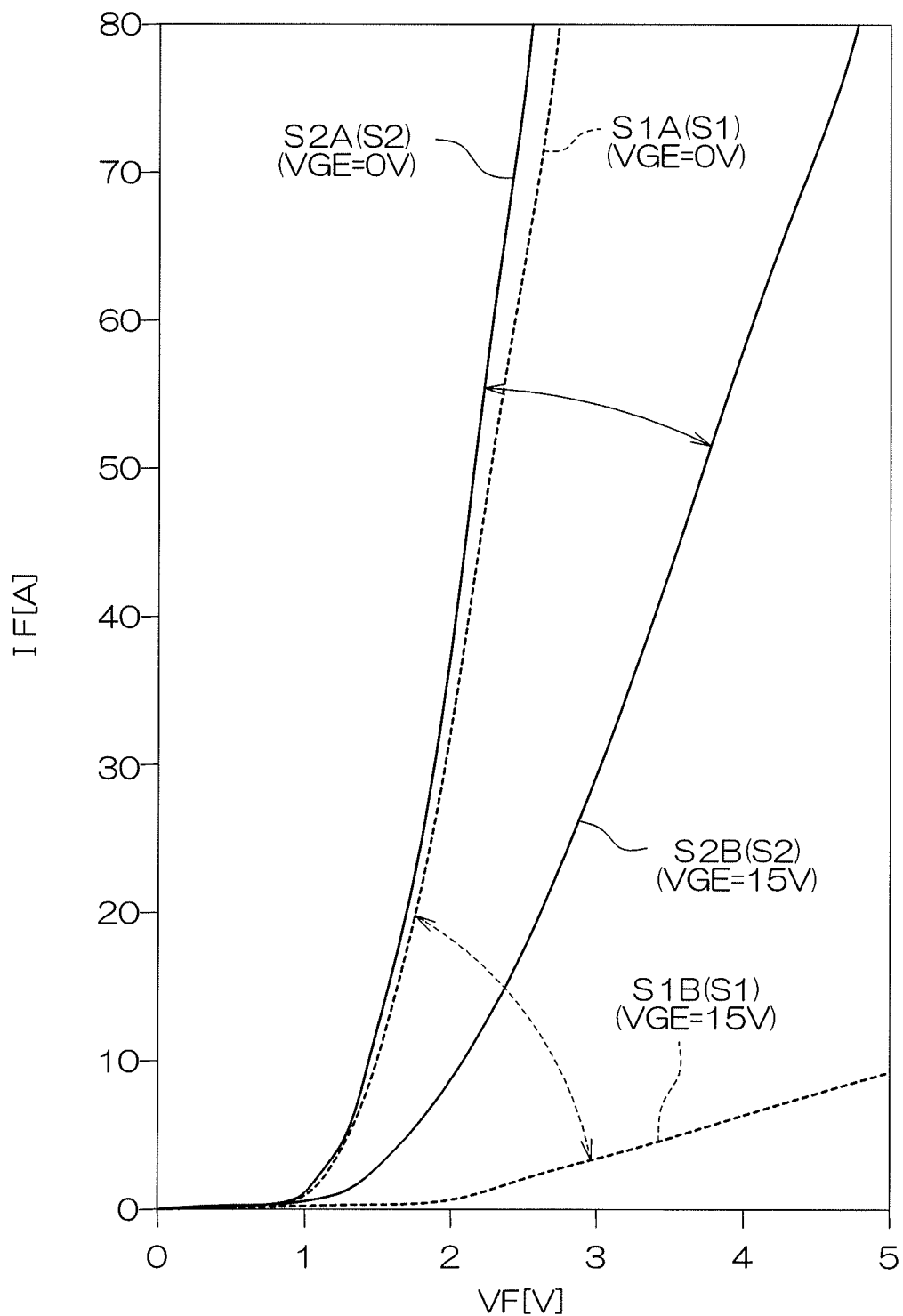
FIG. 6 is a graph in which forward current-forward voltage characteristics of the semiconductor device shown in FIG. 1 are obtained by simulation.

With the semiconductor device 1, forward current IF-forward voltage VF characteristics described by using FIG. 6 can be achieved. FIG. 6 is a graph in which the forward current IF-forward voltage VF characteristics of the semiconductor device 1 shown in FIG. 1 are obtained by simulation. In FIG. 6, the vertical axis indicates the forward current IF, and the horizontal axis indicates the forward voltage VF.

The forward voltage VF is a voltage applied between the emitter electrode 12 and the collector electrode 32. The forward current IF is an electric current flowing between the emitter electrode 12 and the collector electrode 32 when the forward voltage VF is applied.

The forward voltage VF is also a voltage applied between the n⁺ type emitter region 43 and the p⁺ type collector region 35. The forward current IF is also an electric current flowing between the n⁺ type emitter region 43 and the p⁺ type collector region 35.

FIG. 6 shows a first characteristic S1 (see the broken line) and a second characteristic S2 (see the solid line). The first characteristic S1 is a forward current IF-forward voltage VF characteristics of a semiconductor device having no n⁺ type outer cathode region 82 (hereinafter, simply referred to as "semiconductor device according to the first reference example"). The second characteristic S2 is the forward current IF-forward voltage VF characteristics of the semiconductor device 1.

The first characteristic S1 includes a first characteristic S1A determined by a first simulation condition and a second characteristic S1B determined by a second simulation condition. The second characteristic S2 includes a first characteristic 52A determined by the first simulation condition and a second characteristic S2B determined by the second simulation condition.

The first simulation condition is a condition under which the forward voltage VF of not less than 0 V and not more than 5 V is applied in a state where a gate-emitter voltage VGE is 0 V, and the forward current IF is measured. The gate-emitter voltage VGE is a voltage applied between the gate electrode 11 and the emitter electrode 12 (n⁺ type emitter region 43).

The second simulation condition is a condition under which the forward voltage VF of not less than 0 V and not more than 5 V is applied in a state where the gate-emitter voltage VGE is 15 V, and the forward current IF is measured.

With reference to the first characteristic S1A, in the semiconductor device according to the first reference example, the forward current IF-forward voltage VF characteristics by the first simulation condition are normal. However, with reference to the second characteristic S1B, by the second simulation condition, even when the forward voltage VF is increased from 0 V to 5 V, the forward current IF does not exceed 10 A in the semiconductor device according to the first reference example.

It is found that when the forward voltage VF is further applied in a state where the gate-emitter voltage VGE is applied, it is difficult for the forward current IF to flow in the semiconductor device according to the first reference example. Therefore, it is found that, in order to obtain a relatively high forward current IF, a relatively high forward voltage VF should be applied in the semiconductor device according to the first reference example. Such a problem can result in a snap-back phenomenon.

Meanwhile, with reference to the first characteristic S2A, in the semiconductor device 1, the forward current IF-forward voltage VF characteristics by the first simulation condition are normal. With reference to the second characteristic S2B, by the second simulation condition, the forward current IF-forward voltage VF characteristics of the semiconductor device 1 are improved from the forward current IF-forward voltage VF characteristics of the semiconductor device according to the reference example. Thus, it is found that large variation of the forward current IF-forward voltage VF characteristics due to application/non-application of the gate-emitter voltage VGE is suppressed in the semiconductor device 1.

In the semiconductor device 1, in a case where the forward voltage VF of 1.6 V is applied in a state where the gate-emitter voltage VGE is 15 V, the forward current is not less than 2 A. In a case where the forward voltage VF of 2 V is applied in a state where the gate-emitter voltage VGE is 15 V, the forward current is not less than 8 A. In a case where the forward voltage VF of 3 V is applied in a state where the gate-emitter voltage VGE is 15 V, the forward current IF is not less than 20 A.

As described above, with the semiconductor device 1, the IGBT and the free wheeling diode D are formed in the device formation region 6. The freewheeling diode D includes the inner free wheeling diode Di and the outer free wheeling diode Do.

The inner free wheeling diode Di includes the pn junction portion formed in the region between the p type channel region 33 and the n⁻ type drift region 34 in the device formation region 6. The outer free wheeling diode Do includes the pn junction portion formed in the region between the p⁺ type terminal region 51 and the n⁻ type drift region 34 in the outer region 7.

The inner free wheeling diode Di includes the n⁺ type inner cathode region 81 as the cathode and the p type channel region 33 as the anode. The anode electrode of the inner free wheeling diode Di is formed mainly by the emitter pad 22 of the emitter electrode 12. The cathode electrode of the inner free wheeling diode Di is formed by the collector electrode 32 connected to the n⁺ type inner cathode region 81.

The outer free wheeling diode Do includes the n⁺ type outer cathode region 82 as the cathode and the p⁺ type terminal region 51 as the anode. The anode electrode of the outer free wheeling diode Do is formed mainly by the emitter routing portion 23 of the emitter electrode 12. The cathode electrode of the outer free wheeling diode Do is formed by the collector electrode 32 connected to the n⁺ type outer cathode region 82.

With such a structure, even when the forward voltage VF is applied in a state where the gate-emitter voltage VGE is applied, difficulty for the forward current IF to flow can be suppressed (see the second characteristic S2 of FIG. 6). Therefore, deterioration of the forward voltage VF can be suppressed, so that a snap-back phenomenon due to the deterioration of the forward voltage VF can be suppressed.

In the semiconductor device 1, the n⁺ type inner cathode region 81 of the inner freewheeling diode Di includes the line-shaped pattern portion 85 drawn around so as to continuously and non-uniformly extend in the device formation region 6. With such a structure, the following effect to be described with FIG. 7 can be exerted.

Figure 7:
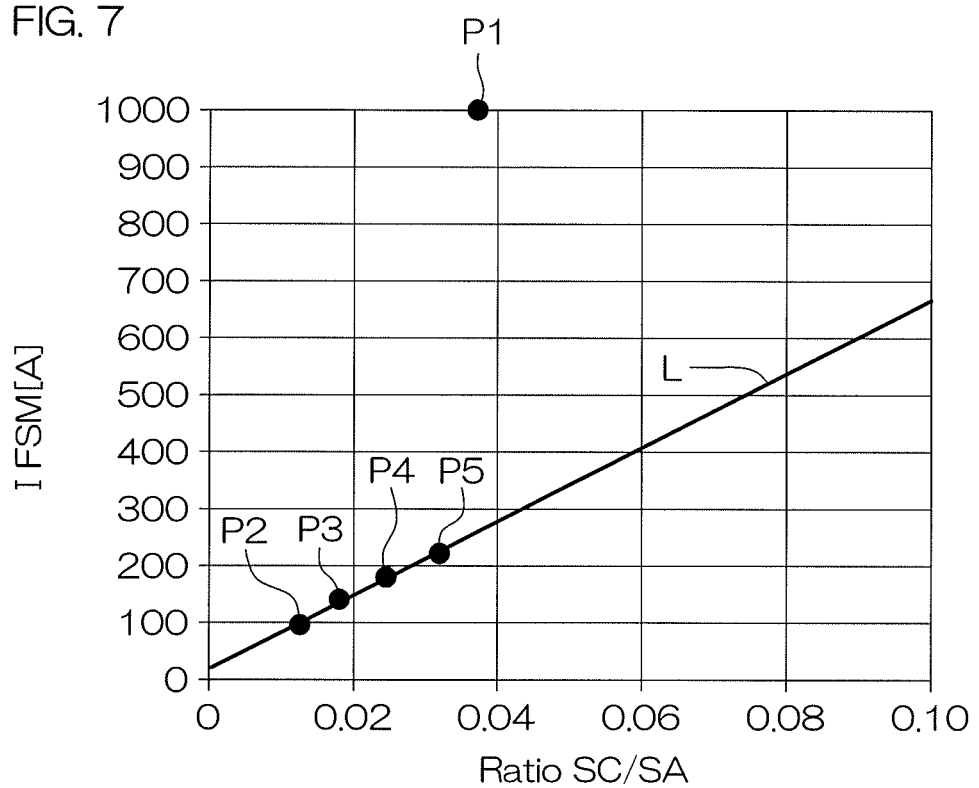
FIG. 7 is a graph in which a peak forward surge current of the semiconductor device shown in FIG. 1 is obtained by simulation.

FIG. 7 is a graph in which a peak forward surge current IFSM of the semiconductor device 1 shown in FIG. 1 is obtained by simulation. In FIG. 7, the vertical axis indicates the peak forward surge current IFSM, and the horizontal axis indicates the area ratio SC/SA of the $n^+$ type inner cathode region 81.

The peak forward surge current IFSM is the peak value of a commercial sinusoidal current of not less than one cycle that is tolerated within a range in which the semiconductor device 1 does not break down. The higher the peak forward surge current IFSM, the better the resistance of the semiconductor device 1 against the peak forward surge current IFSM (hereinafter, simply referred to as "peak forward surge current resistance").

FIG. 7 shows a plotted point P1. The plotted point P1 shows characteristics of the peak forward surge current IFSM of the semiconductor device 1. The plotted point P1 shows characteristics of the peak forward surge current IFSM in a case where the area ratio SC/SA of the $n^+$ type inner cathode region 81 is 0.037 (3.70).

FIG. 7 also shows plotted points P2, P3, P4, and P5. The plotted points P2 to P5 show characteristics of the peak forward surge current IFSM of a semiconductor device according to a second reference example. The plotted points P2 to P5 are connected by an approximation line L.

The semiconductor device according to the second reference example does not include the $n^+$ type outer cathode region 82. The $n^+$ type inner cathode region 81 of the semiconductor device according to the second reference example is formed in a regular arrays-of-dots pattern in the device formation region 6.

The plotted point P2 shows characteristics of the peak forward surge current IFSM in a case where the area ratio SC/SA of the $n^+$ type inner cathode region 81 is 0.012 (1.2%). The plotted point P3 shows characteristics of the peak forward surge current IFSM in a case where the area ratio SC/SA of the $n^+$ type inner cathode region 81 is 0.019 (1.9%).

The plotted point P4 shows characteristics of the peak forward surge current IFSM in a case where the area ratio SC/SA of the $n^+$ type inner cathode region 81 is 0.023 (2.4%). The plotted point P5 shows characteristics of the peak forward surge current IFSM in a case where the area ratio SC/SA of the $n^+$ type inner cathode region 81 is 0.032 (3.2%).

With reference to the approximation line L, when the area ratio SC/SA of the $n^+$ type inner cathode region 81 becomes smaller, the peak forward surge current IFSM is lowered. When the area ratio SC/SA of the $n^+$ type inner cathode region 81 becomes larger, the peak forward surge current IFSM is increased. Therefore, in the semiconductor device according to the second reference example, a generally linear relationship is established between the planar area SC and the peak forward surge current IFSM.

However, in the semiconductor device according to the second reference example, even in a case where the area ratio SC/SA of the $n^+$ type inner cathode region 81 is any value, the peak forward surge current IFSM is a relatively low value (less than 700 A).

With reference to the approximation line L, in the semiconductor device according to the second reference example, it is considered that when the area ratio SC/SA of the $n^+$ type inner cathode region 81 comes close to "one," a relatively high value of the peak forward surge current IFSM can be realized.

However, in reality, as the area ratio SC/SA of the $n^+$ type inner cathode region 81 comes closer to "one," the area ratio SD/SA of the $p^+$ type collector region 35 comes closer to "zero." Thus, the function of the IGBT is lost.

Therefore, in the semiconductor device according to the second reference example, even when the area ratio SC/SA of the $n^+$ type inner cathode region 81 is adjusted, the peak forward surge current IFSM can be adjusted only within the linear relationship shown by the approximation line L at the end.

Such a linear relationship is particularly notable in a case where plural $n^+$ type inner cathode regions 81 formed in a square shape, a circular shape, etc., in the plan view are arranged in regular arrays in the device formation region 6.

Thus, the semiconductor device 1 adopts a structure where the $n^+$ type inner cathode region 81 includes the line-shaped pattern portion 85 continuously and non-uniformly extending in the device formation region 6.

Thereby, the peak forward surge current IFSM can be set separately from the linear relationship shown by the approximation line L (see the plotted point P1 of FIG. 7). More specifically, with the semiconductor device 1, the peak forward surge current IFSM of not less than 700 A (not less than 900 A in FIG. 7) can be realized.

As described above, it is possible to provide the semiconductor device 1 with which the deterioration of the forward voltage VF can be suppressed by including the $n^+$ type inner cathode region 81 and the $n^+$ type outer cathode region 82. Thus, it is possible to provide the semiconductor device 1 with which the peak forward surge current resistance can be improved by the $n^+$ type inner cathode region 81 including the continuously and non-uniformly extending line-shaped pattern portion 85.

The structure of the $n^+$ type outer cathode region 82 and the structure of the $n^+$ type inner cathode region 81 are not limited to the preferred embodiment described above but various other modes are available. Hereinafter, modification examples of the $n^+$ type outer cathode region 82 and modification examples of the $n^+$ type inner cathode region 81 will be described.

Figure 8:
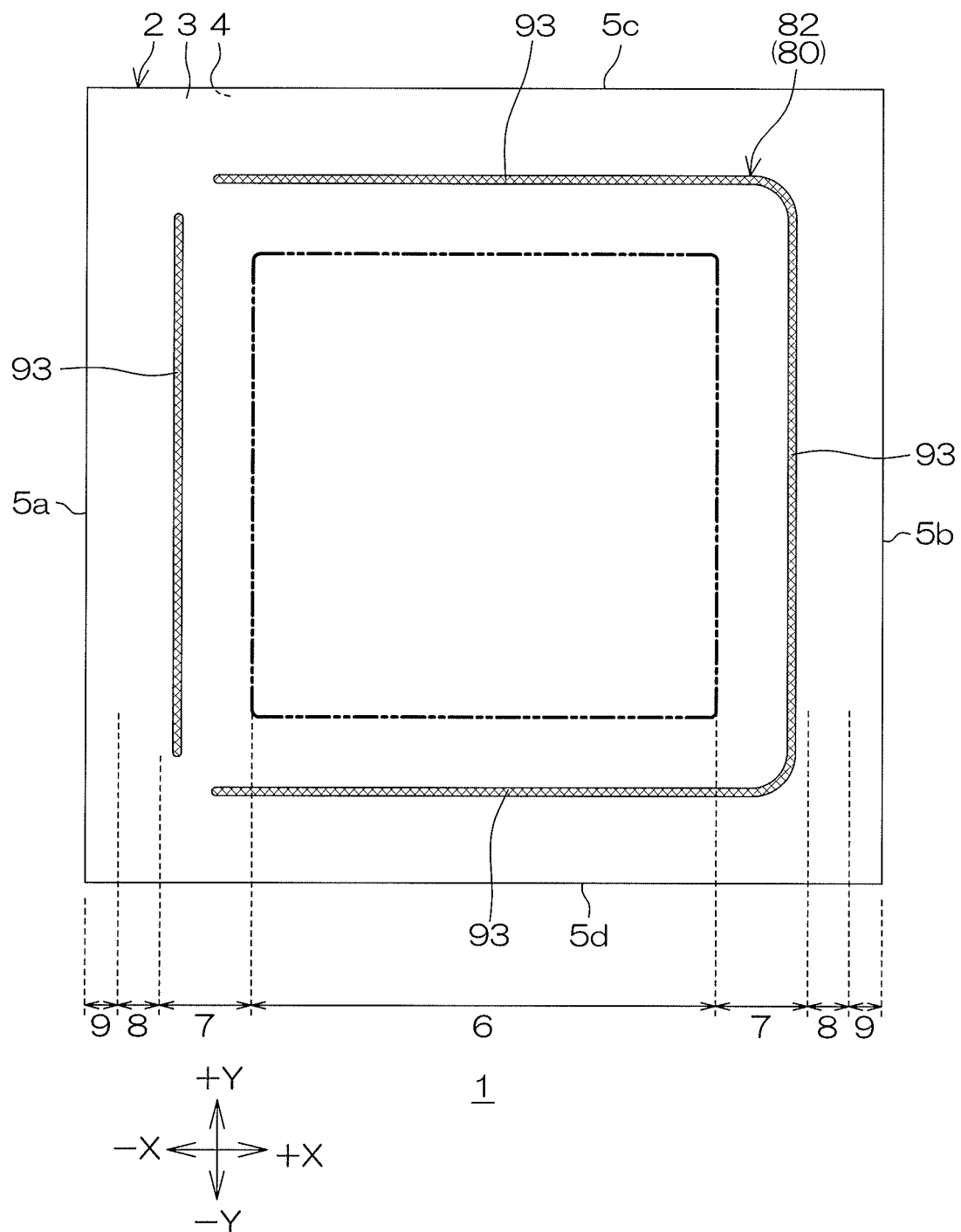
FIG. 8 is a plan view showing a first modification example of an outer cathode region.

FIG. 8 is a plan view showing a first modification example of the $n^+$ type outer cathode region 82. FIG. 8 is a plan view corresponding to FIG. 4. In FIG. 8, structures corresponding to the structures shown in FIG. 4, etc., will be provided with the same reference symbols and description thereof will be omitted.

In FIG. 8, for convenience of description, only the $n^+$ type outer cathode region 82 is shown and the structures, etc., within the device formation region 6 are omitted. In FIG. 8, the $n^+$ type outer cathode region 82 is shown by cross-hatching.

The $n^+$ type outer cathode region 82 according to the present modification example has an ended-shaped structure in which an arbitrary one of the four line-shaped pattern portions 93 is formed as a separate body from the other line-shaped pattern portions 93.

The $n^+$ type outer cathode region 82 may have a structure in which two or three of the four line-shaped pattern portions 93 are formed as separate bodies from the other line-shaped pattern portions 93.

The $n^+$ type outer cathode region 82 may have a structure in which at least one of the four line-shaped pattern portions 93 is formed as a separate body from the other line-shaped pattern portions 93.

The n⁺ type outer cathode region 82 may have a structure in which at least two adjacent line-shaped pattern portions 93 among the four line-shaped pattern portions 93 are connected to each other.

With the semiconductor device 1 having the n⁺ type outer cathode region 82 of such a structure, the operations and the effects which are substantially similar to the operations and the effects described above can also be exerted.

Figure 9:
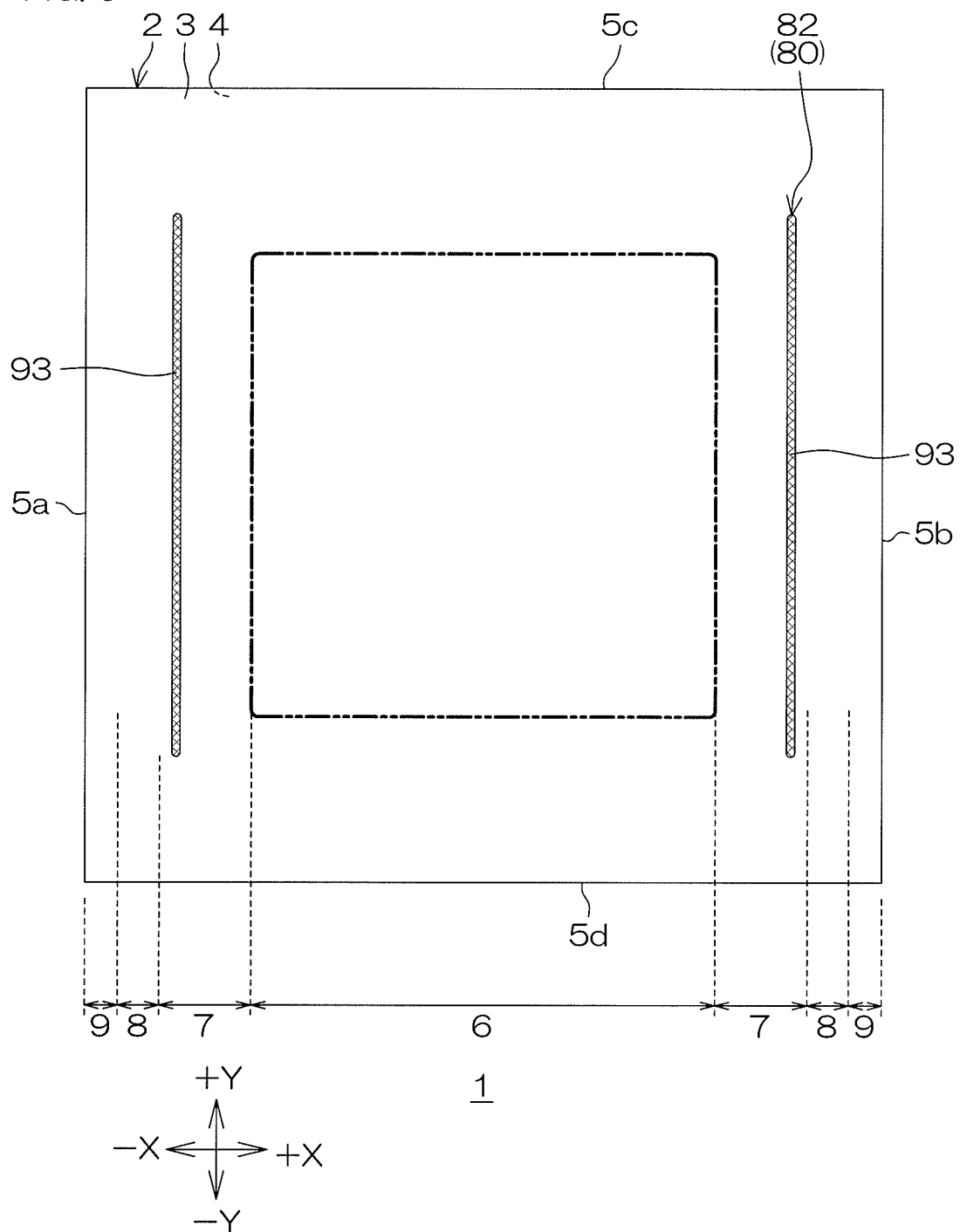
FIG. 9 is a plan view showing a second modification example of the outer cathode region.

FIG. 9 is a plan view showing a second modification example of the n⁺ type outer cathode region 82. FIG. 9 is a plan view corresponding to FIG. 4. In FIG. 9, structures corresponding to the structures shown in FIG. 4, etc., will be provided with the same reference symbols and description thereof will be omitted.

In FIG. 9, for convenience of description, only the n⁺ type outer cathode region 82 is shown and the structures, etc., within the device formation region 6 are omitted. In FIG. 9, the n⁺ type outer cathode region 82 is shown by cross-hatching.

The n⁺ type outer cathode region 82 according to the present modification example has plural line-shaped pattern portions 93 which are formed as separated bodies from each other. The plural line-shaped pattern portions 93 are respectively formed along two sides facing each other among four sides of the device formation region 6.

The n⁺ type outer cathode region 82 may include two line-shaped pattern portions 93 formed along only arbitrary two sides crossing each other among four sides of the device formation region 6. The n⁺ type outer cathode region 82 may include one line-shaped pattern portion 93 formed along only arbitrary one side among four sides of the device formation region 6.

The n⁺ type outer cathode region 82 may include three line-shaped pattern portions 93 formed along arbitrary three sides among four sides of the device formation region 6. The n⁺ type outer cathode region 82 may include a line-shaped pattern portion 93 formed along at least one side among four sides of the device formation region 6.

With the semiconductor device 1 having the n⁺ type outer cathode region 82 of such a structure, the operations and the effects which are substantially similar to the operations and the effects described above can also be exerted.

Figure 10:
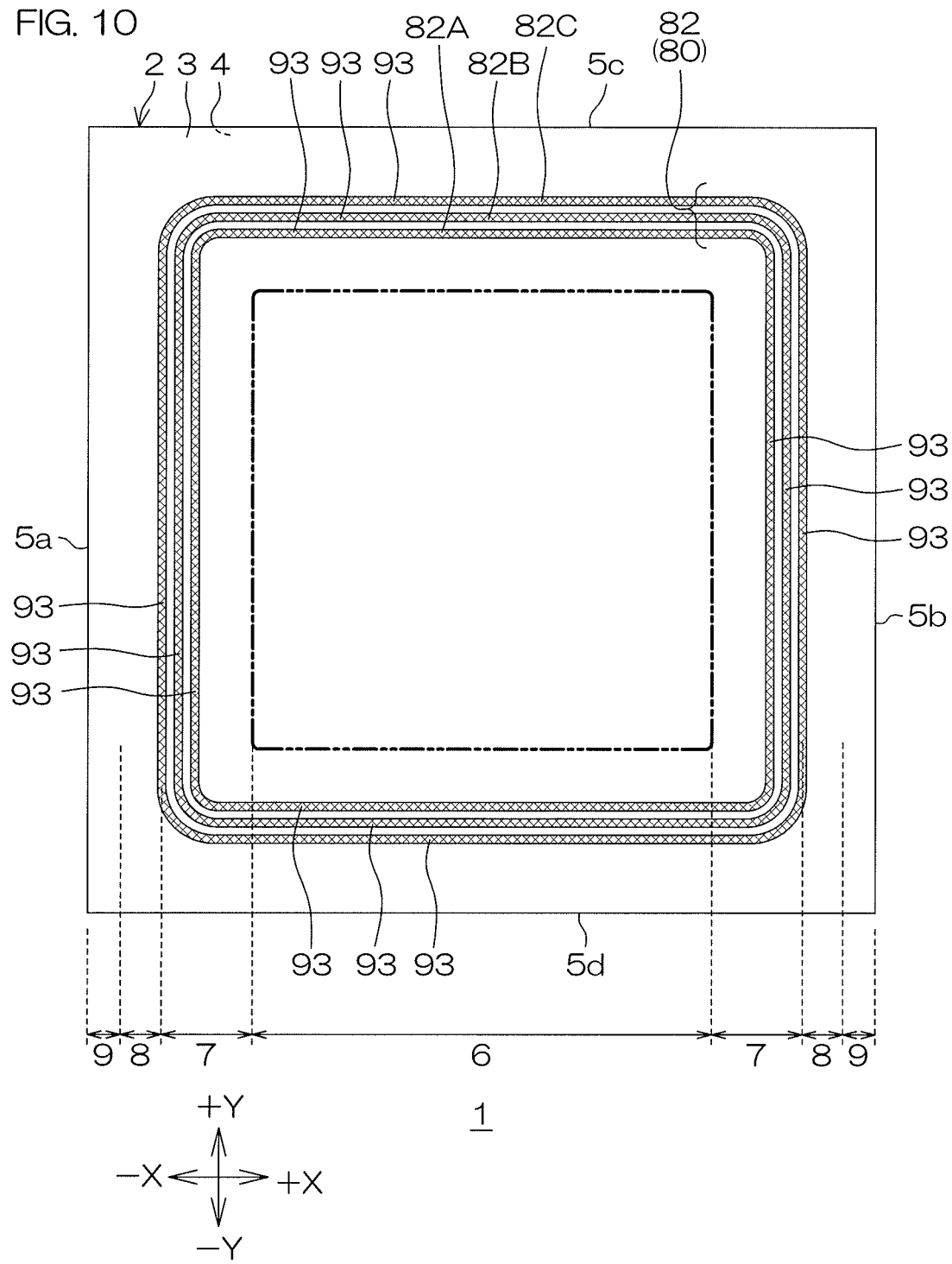
FIG. 10 is a plan view showing a third modification example of the outer cathode region.

FIG. 10 is a plan view showing a third modification example of the n⁺ type outer cathode region 82. FIG. 10 is a plan view corresponding to FIG. 4. In FIG. 10, structures corresponding to the structures shown in FIG. 4, etc., will be provided with the same reference symbols and description thereof will be omitted.

In FIG. 10, for convenience of description, only the n⁺ type outer cathode regions 82 are shown and the structures, etc., within the device formation region 6 are omitted. In FIG. 10, the n⁺ type outer cathode regions 82 are shown by cross-hatching.

In the present modification example, the plural n⁺ type outer cathode regions 82 are formed. The plural n⁺ type outer cathode regions 82 include a first n⁺ type outer cathode region 82A, a second n⁺ type outer cathode region 82B, and a third n⁺ type outer cathode region 82C. The first to third n⁺ type outer cathode regions 82A, 82B, 82C are formed to be spaced from each other in this order from the outer region 7 toward the withstand voltage retention region 8.

The first to third n⁺ type outer cathode regions 82A, 82B, 82C may be formed in the outer region 7. At least one of the first to third n⁺ type outer cathode regions 82A, 82B, 82C may be formed in the withstand voltage retention region 8. The third n⁺ type outer cathode region 82C may be formed in the withstand voltage retention region 8.

The first n⁺ type outer cathode region 82A includes a line-shaped pattern portion 93 drawn around so as to continuously extend along the periphery of the device formation region 6. The first n⁺ type outer cathode region 82A is formed in an endless shape (square ring shape) surrounding the device formation region 6 in the plan view.

The second n⁺ type outer cathode region 82B includes a line-shaped pattern portion 93 drawn around so as to continuously extend along a periphery of the first n⁺ type outer cathode region 82A. The second n⁺ type outer cathode region 82B is formed in an endless shape (square ring shape) surrounding the first n⁺ type outer cathode region 82A in the plan view.

The third n⁺ type outer cathode region 82C includes a line-shaped pattern portion 93 drawn around so as to continuously extend along a periphery of the second n⁺ type outer cathode region 82B. The third n⁺ type outer cathode region 82C is formed in an endless shape (square ring shape) surrounding the second n⁺ type outer cathode region 82B in the plan view.

With the semiconductor device 1 having the n⁺ type outer cathode regions 82 of such a structure, the operations and the effects which are substantially similar to the operations and the effects described above can also be exerted. In the present modification example, the number of the n⁺ type outer cathode regions 82 is not limited to three. Two n⁺ type outer cathode regions 82 may enclose the device formation region 6. Four or more n⁺ type outer cathode regions 82 may enclose the device formation region 6.

Figure 11:
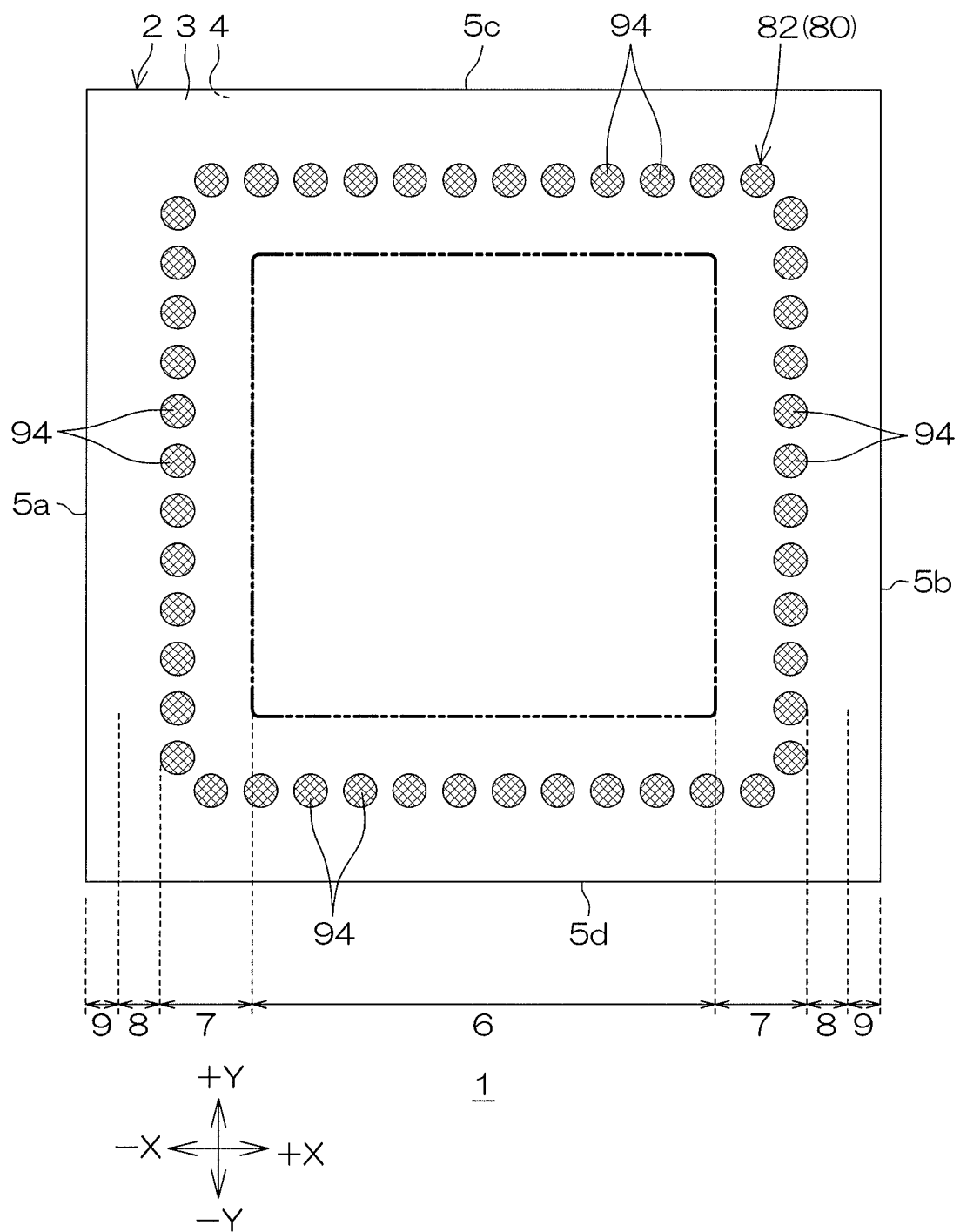
FIG. 11 is a plan view showing a fourth modification example of the outer cathode region.

FIG. 11 is a plan view showing a fourth modification example of the n⁺ type outer cathode region 82. FIG. 11 is a plan view corresponding to FIG. 4. In FIG. 11, structures corresponding to the structures shown in FIG. 4, etc., will be provided with the same reference symbols and description thereof will be omitted.

In FIG. 11, for convenience of description, only the n⁺ type outer cathode region 82 is shown and the structures, etc., within the device formation region 6 are omitted. In FIG. 11, the n⁺ type outer cathode region 82 is shown by cross-hatching.

The n⁺ type outer cathode region 82 according to the present modification example includes plural dot-shaped pattern portions 94. The plural dot-shaped pattern portions 94 are formed to be spaced from each other along the periphery of the device formation region 6.

In the present modification example, the n⁺ type outer cathode region 82 includes the dot-shaped pattern portions 94 formed in a circular shape in the plan view. The n⁺ type outer cathode region 82 may include dot-shaped pattern portions 94 formed in a polygonal shape such as a triangle, a square, and a hexagon in the plan view in place of, or in addition to the circular dot-shaped pattern portions 94. The n⁺ type outer cathode region 82 may include dot-shaped pattern portions 94, etc., formed in an oval shape in the plan view in place of, or in addition to the circular dot-shaped pattern portions 94.

With the semiconductor device 1 having the n⁺ type outer cathode region 82 of such a structure, the operations and the effects which are substantially similar to the operations and the effects described above can also be exerted.

The n⁺ type outer cathode regions 82 according to the first preferred embodiment described above and the first to fourth modification examples described above may be arbitrarily combined with each other.

For example, the dot-shaped pattern portions 94 according to the fourth modification example may be combined with the first to third modification examples. In this case, the n+ type outer cathode region 82 includes the line-shaped pattern portions 93 drawn around so as to continuously extend along the periphery of the device formation region 6, and the dot-shaped pattern portions 94 formed to be spaced from each other along the periphery of the device formation region 6.

Figure 12:
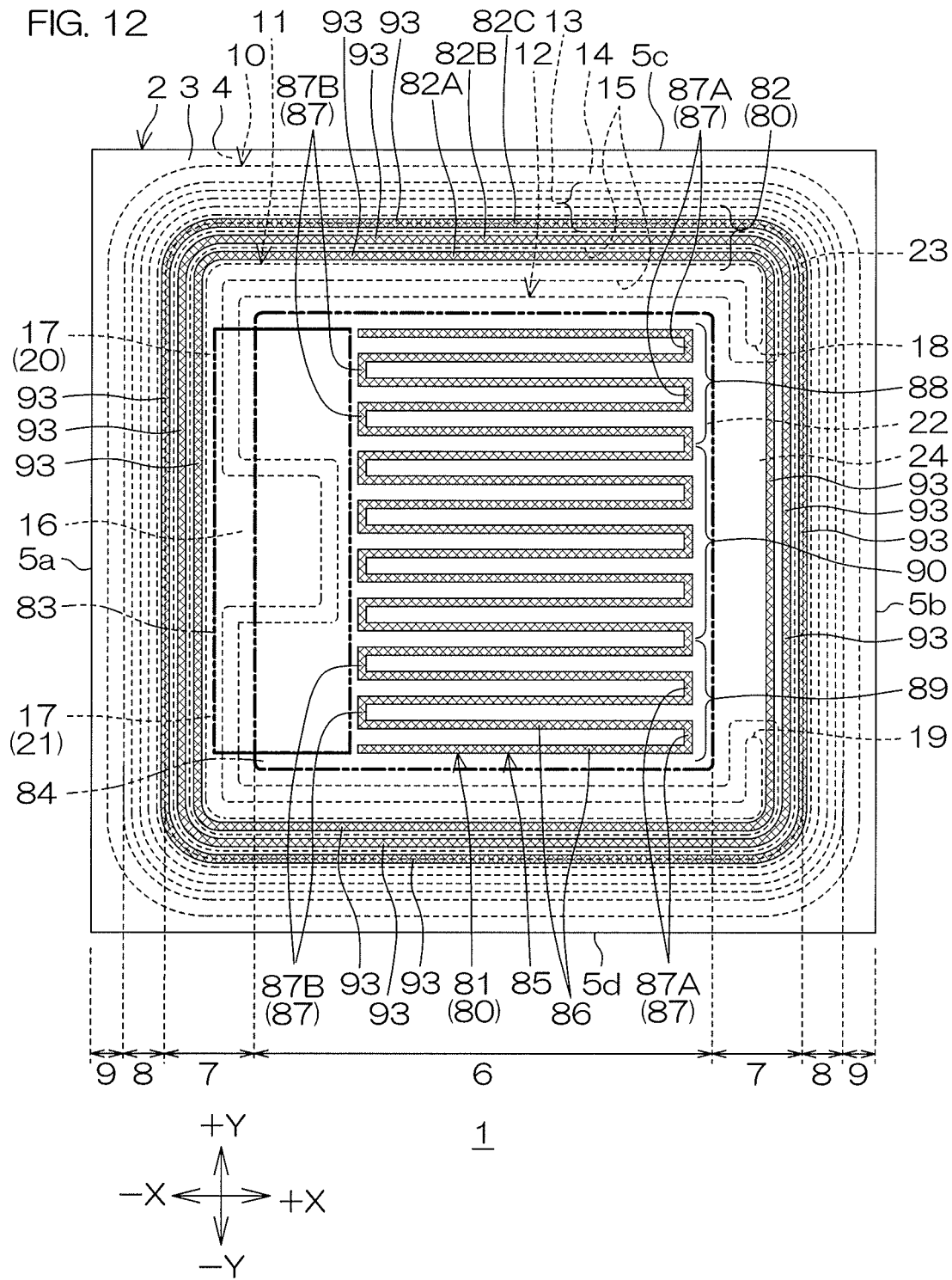
FIG. 12 is a plan view showing a first modification example of an inner cathode region.

FIG. 12 is a plan view showing a first modification example of the n+ type inner cathode region 81. FIG. 12 is a plan view corresponding to FIG. 4. In FIG. 12, structures corresponding to the structures shown in FIG. 4, etc., will be provided with the same reference symbols and description thereof will be omitted.

FIG. 12 shows an example in which the n+ type outer cathode regions 82 according to the third modification example described above (see FIG. 10) are applied. In FIG. 12, the n+ type inner cathode region 81 and the n+ type outer cathode regions 82 are shown by cross-hatching.

The n+ type inner cathode region 81 according to the present modification example has a structure in which the first line group 88 does not include the first line drawing out portion 91 and the second line group 89 does not include the second line drawing out portion 92.

The n+ type inner cathode region 81 according to the present modification example is unevenly placed on the +X direction side of the device formation region 6. The n+ type inner cathode region 81 is formed in a pattern non-uniform (non-symmetric with respect to a point) with respect to the device formation region 6.

The n+ type inner cathode region 81 may have a structure in which the first line group 88 includes the first line drawing out portion 91 whereas the second line group 89 does not include the second line drawing out portion 92. The n+ type inner cathode region 81 may have a structure in which the first line group 88 does not include the first line drawing out portion 91 whereas the second line group 89 includes the second line drawing out portion 92.

With the semiconductor device 1 having the n+ type inner cathode region 81 of such a structure, the operations and the effects which are substantially similar to the operations and the effects described above can also be exerted.

Figure 13:
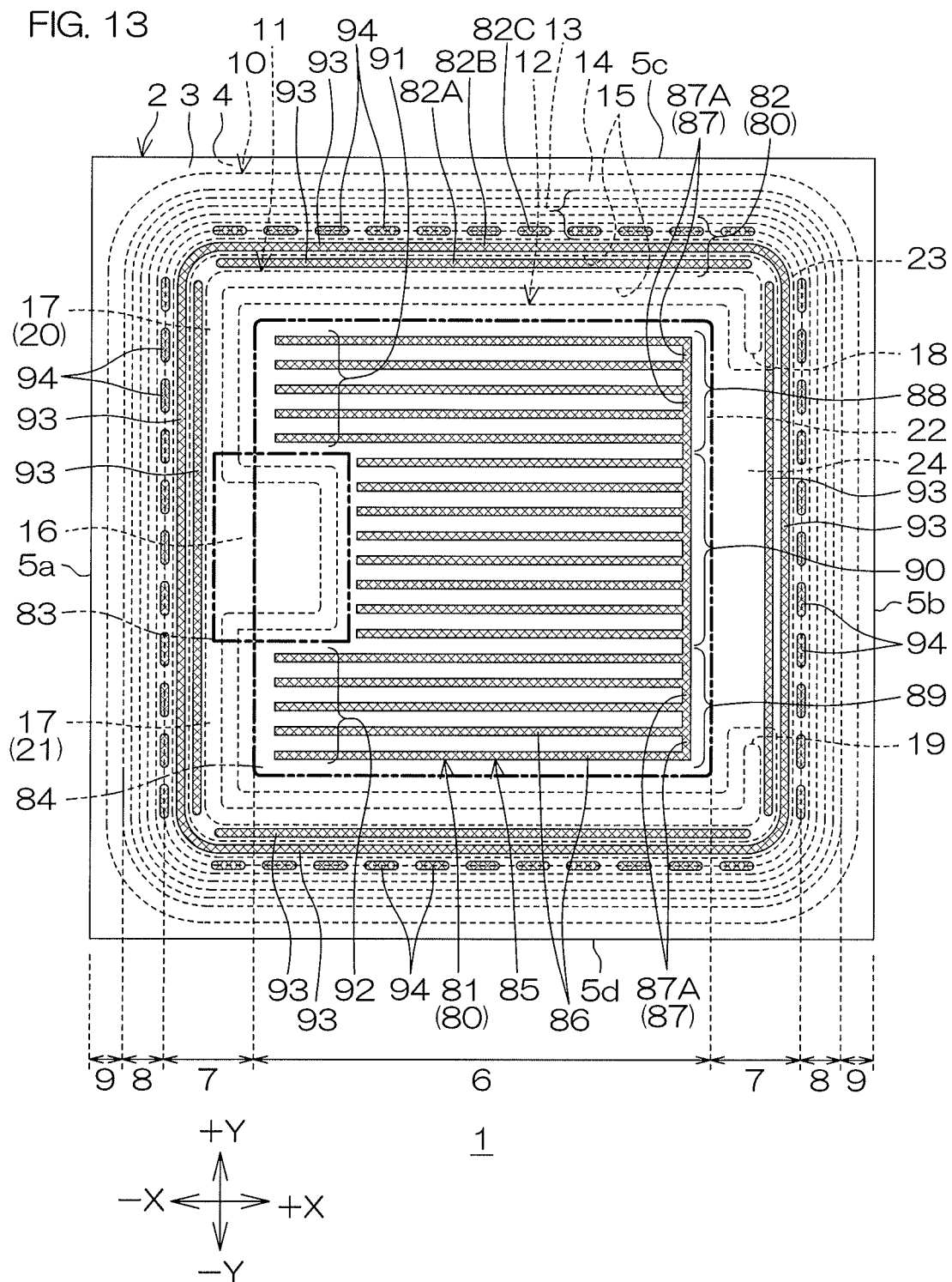
FIG. 13 is a plan view showing a second modification example of the inner cathode region.

FIG. 13 is a plan view showing a second modification example of the n+ type inner cathode region 81. FIG. 13 is a plan view corresponding to FIG. 4. In FIG. 13, structures corresponding to the structures shown in FIG. 4, etc., will be provided with the same reference symbols and description thereof will be omitted.

FIG. 13 shows an example in which n+ type outer cathode regions 82 formed by combining the n+ type outer cathode region 82 according to the second modification example (see FIG. 9) and the n+ type outer cathode region 82 according to the fourth modification example (see FIG. 11) with the n+ type outer cathode regions 82 according to the third modification example (see FIG. 10) are applied. In FIG. 13, the n+ type inner cathode region 81 and the n+ type outer cathode regions 82 are shown by cross-hatching.

The n+ type inner cathode region 81 according to the present modification example includes comb-shaped line-shaped pattern portions 85 continuing to each other in the plan view. More specifically, in the n+ type inner cathode region 81 according to the present modification example, the second lines 87 include only the second lines 87A each of which connects the +X direction end portions of the first lines 86 adjacent to each other in the Y direction. Thereby, the n+ type inner cathode region 81 is formed to be non-uniform (non-symmetric with respect to a point) with respect to the device formation region 6.

With the semiconductor device 1 of such a structure, the operations and the effects which are substantially similar to the operations and the effects of the first preferred embodiment described above can also be exerted.

Figure 14:
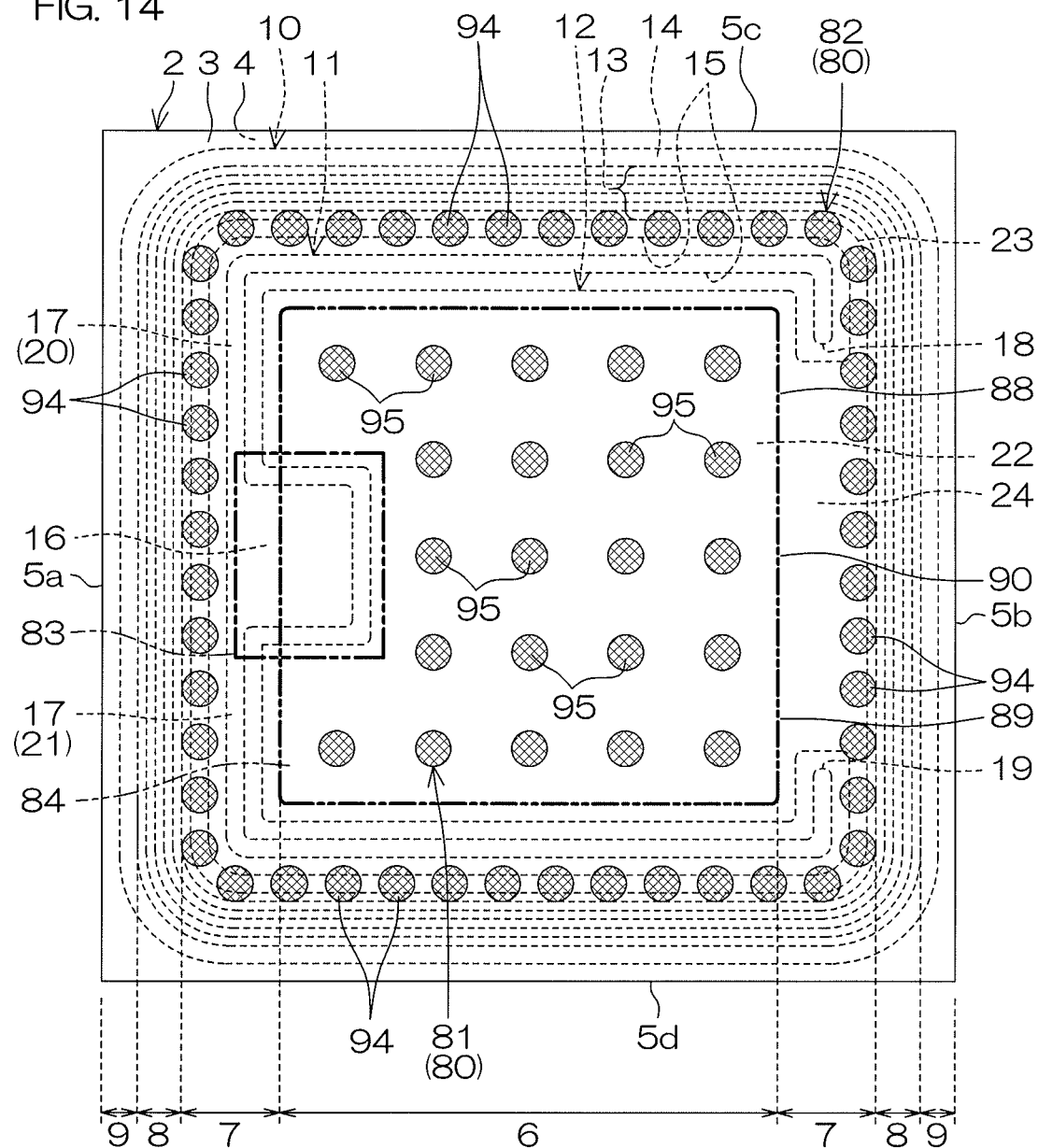
FIG. 14 is a plan view showing a third modification example of the inner cathode region.

FIG. 14 is a plan view showing a second modification example of the n+ type inner cathode region 81. FIG. 14 is a plan view corresponding to FIG. 4. In FIG. 14, structures corresponding to the structures shown in FIG. 4, etc., will be provided with the same reference symbols and description thereof will be omitted.

FIG. 14 shows an example in which the n+ type outer cathode region 82 according to the fourth modification example described above (see FIG. 11) is applied. In FIG. 14, the n+ type inner cathode region 81 and the n+ type outer cathode region 82 are shown by cross-hatching.

The n+ type inner cathode region 81 according to the present modification example includes plural dot-shaped pattern portions 95. The plural dot-shaped pattern portions 95 are arranged in arrays to be spaced from each other in the X direction and the Y direction in the cathode formation region 84 formed by excluding the free space region 83 from the device formation region 6.

The n+ type inner cathode region 81 may include plural dot-shaped pattern portions 95 arranged in a zigzag form in place of, or in addition to the plural dot-shaped pattern portions 95 arranged in arrays. The n+ type inner cathode region 81 is formed in a pattern non-uniform (non-symmetric with respect to a point) with respect to the device formation region 6.

In the present modification example, the n+ type inner cathode region 81 includes the dot-shaped pattern portions 95 formed in a circular shape in the plan view. The n+ type inner cathode region 81 may include dot-shaped pattern portions 95 formed in a polygonal shape such as a triangle, a square, and a hexagon in the plan view in place of, or in addition to the circular dot-shaped pattern portions 95. The n+ type inner cathode region 81 may include dot-shaped pattern portions 95, etc., formed in an oval shape in the plan view in place of, or in addition to the circular dot-shaped pattern portions 95.

In the semiconductor device 1 of such a structure, it is considered to be difficult to set the peak forward surge current IFSM separately from the linear relationship established between the planar area SC of the n+ type inner cathode region 81 and the peak forward surge current IFSM (see the approximation line L of FIG. 7). However, since the n+ type outer cathode region 82 is formed, the deterioration of the forward voltage VF can be suppressed.

With the present modification example, combination of the n+ type inner cathode region 81 including the line-shaped pattern portion 85 and/or the dot-shaped pattern portions 95, and the n+ type outer cathode region 82 including the line-shaped pattern portions 93 and/or the dot-shaped pattern portions 94 is allowed. Thereby, an advantage that the forward voltage VF and the peak forward surge current IFSM can be set without providing an unnecessary restriction on degree of freedom of design can be obtained.

Figure 15:
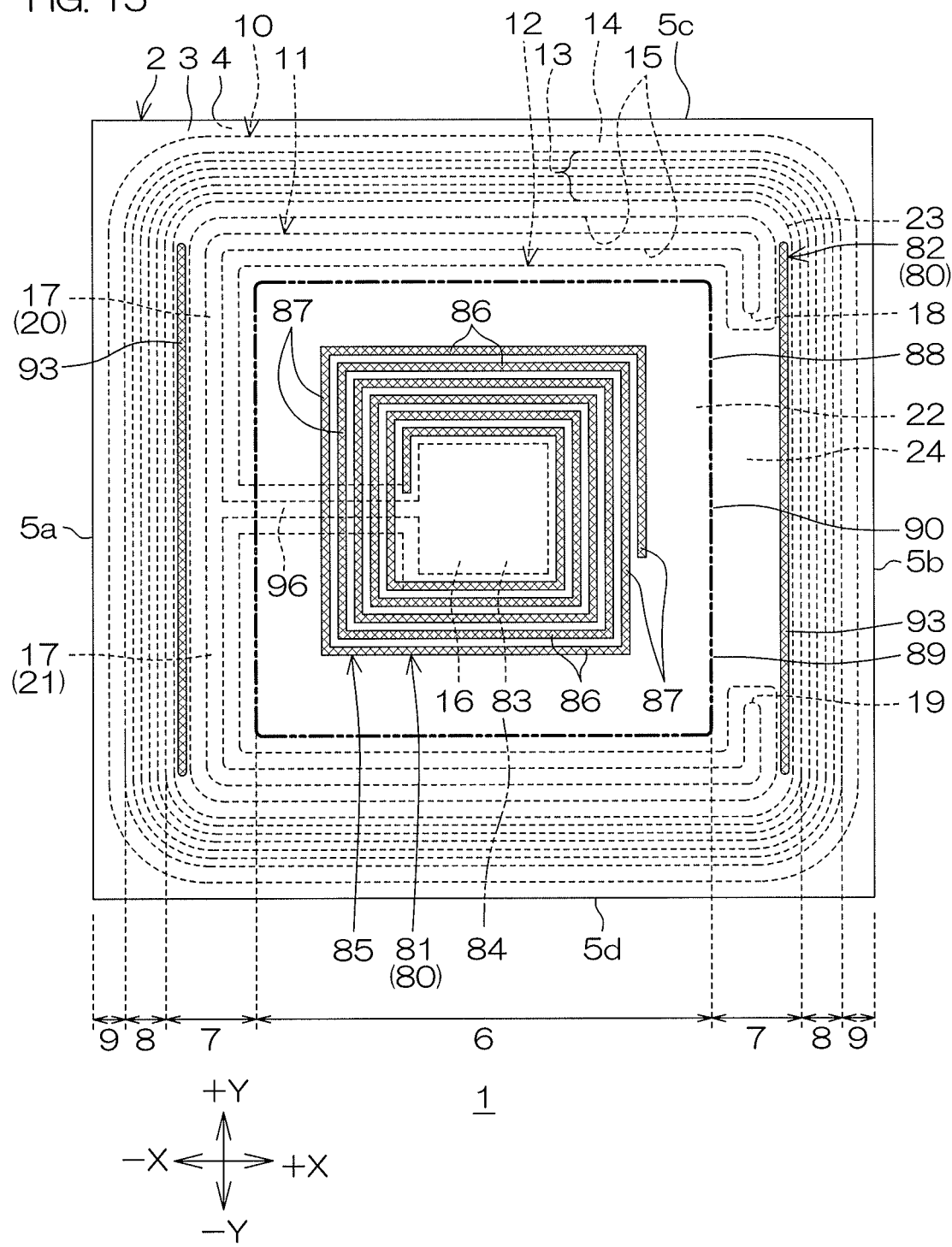
FIG. 15 is a plan view showing a fourth modification example of the inner cathode region.

FIG. 15 is a plan view showing a fourth modification example of the n+ type inner cathode region 81. FIG. 15 is a plan view corresponding to FIG. 4. In FIG. 15, structures corresponding to the structures shown in FIG. 4, etc., will be provided with the same reference symbols and description thereof will be omitted.

FIG. 15 shows an example in which the n+ type outer cathode region 82 according to the second modification example described above (see FIG. 9) is applied. In FIG. 15, the n+ type inner cathode region 81 and the n+ type outer cathode region 82 are shown by cross-hatching.

With reference to FIG. 15, in the present modification example, the gate pad 16 is formed in a central region of the device formation region 6 in the plan view, and the gate finger 17 is formed in the outer region 7. The gate pad 16 is connected to the gate finger 17 via a connecting portion 96. The connecting portion 96 is drawn out from the gate pad 16 toward the outer region 7.

The emitter pad 22 is formed in a C-shaped region partitioned by the peripheral edge of the gate pad 16, the peripheral edge of the gate finger 17, and a peripheral edge of the connecting portion 96 in the plan view. In this embodiment, the emitter pad 22 is formed in a C shape formed along an inner edge of the gate pad 16 and an inner edge of the gate finger 17 in the plan view.

In the present modification example, on the second principal surface 4 of the semiconductor layer 2, the free space region 83 is set in a region immediately below the gate pad 16 formed in the central region of the device formation region 6. The cathode formation region 84 is set in a region between a peripheral edge of the free space region 83 and the peripheral edge of the device formation region 6.

The n+ type inner cathode region 81 according to the present modification example includes a line-shaped pattern portion 85 formed in a square-spiral shape continuously extending to enclose the free space region 83 in the plan view. The line-shaped pattern portion 85 according to the present modification example includes plural first lines 86 and plural second lines 87 as in the case of the first preferred embodiment described above.

The n+ type inner cathode region 81 is formed in a region excluding the central region of the device formation region 6. With such a structure, the n+ type inner cathode region 81 is formed in a pattern non-uniform (non-symmetric with respect to a point) with respect to the device formation region 6.

With the semiconductor device 1 having such a structure, the operations and the effects which are substantially similar to the operations and the effects described above can also be exerted.

In the present modification example, the example in which the n+ type inner cathode region 81 includes the line-shaped pattern portion 85 formed in a square-spiral shape in the plan view is described. However, the n+ type inner cathode region 81 may include a line-shaped pattern portion 85 formed in a circular-spiral shape in the plan view. The n+ type inner cathode region 81 may include a line-shaped pattern portion formed in a polygonal-spiral shape which is a non-square-spiral shape such as a triangle-, or hexagon-spiral shape in the plan view.

The n+ type inner cathode regions 81 according to the first preferred embodiment described above and the first to fourth modification examples described above may be arbitrarily combined with each other.

For example, the n+ type inner cathode region 81 including the dot-shaped pattern portions 95 according to the fourth modification example (see FIG. 15) may be combined with a part of the n+ type inner cathode region 81 including the line-shaped pattern portion 85 of a meandering form according to the first preferred embodiment. In this case, the n+ type inner cathode region 8/ has a structure including the line-shaped pattern portion 85 of a meandering form and the dot-shaped pattern portions 95.

For example, the comb-shaped n+ type inner cathode region 81 according to the second modification example (see FIG. 13) may be combined with a part of the n+ type inner cathode region 81 of a meandering form according to the first preferred embodiment. In this case, the n+ type inner cathode region 81 according to the first preferred embodiment has a structure including the line-shaped pattern portion 85 of a meandering form and the comb-shaped line-shaped pattern portions 85. As a matter of course, the n+ type inner cathode region 81 of a structure including the line-shaped pattern portion 85 of a meandering form, the comb-shaped line-shaped pattern portions 85, and the dot-shaped pattern portions 95 may be adopted.

Figure 16:
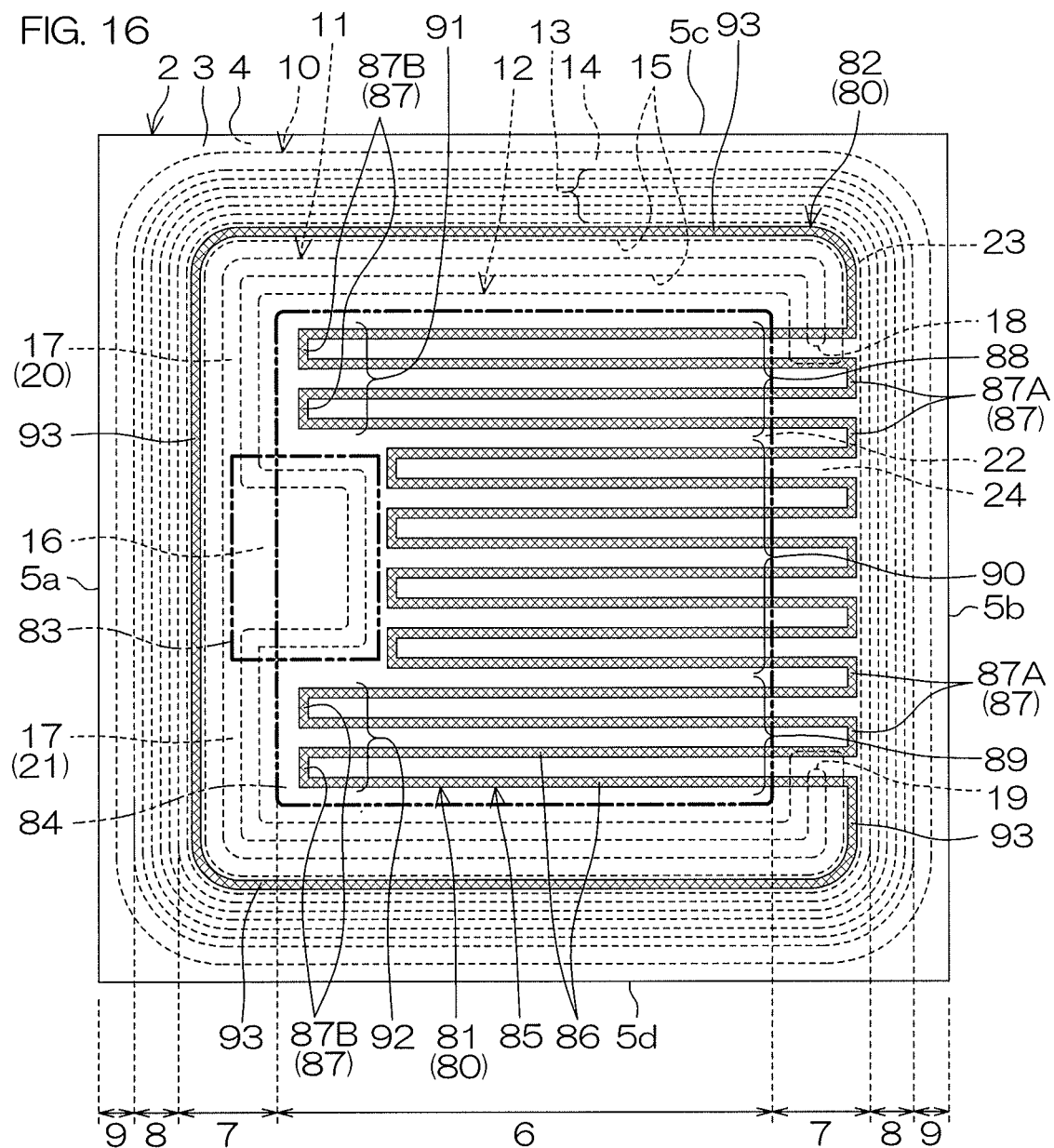
FIG. 16 is a view showing a modification example of a cathode region.

FIG. 16 is a plan view showing a modification example of the n+ type cathode region 80. FIG. 16 is a plan view corresponding to FIG. 4. In FIG. 16, structures corresponding to the structures shown in FIG. 4, etc., will be provided with the same reference symbols and description thereof will be omitted. In FIG. 16, the n+ type inner cathode region 81 and the n+ type outer cathode region 82 are shown by cross-hatching.

In the present modification example, the n+ type inner cathode region 81 and the n+ type outer cathode region 82 are integrated. The figure shows an example in which the n+ type inner cathode region 81 of a meandering form and the n+ type outer cathode region 82 formed in a square ring shape in the plan view are integrated.

A portion of the n+ type inner cathode region 81 drawn out as a part of the n+ type outer cathode region 82 forms a part of the outer free wheeling diode Do in the outer region 7. A portion of the n+ type outer cathode region 82 drawn out as a part of the n+ type inner cathode region 81 forms a part of the inner free wheeling diode Di in the device formation region 6.

With the semiconductor device 1 having such a structure, the operations and the effects which are substantially similar to the operations and the effects described above can also be exerted.

In an arbitrary combination structure of the n+ type outer cathode regions 82 according to the first to fourth modification examples (see FIGS. 8 to 11) and the n+ type inner cathode regions 81 according to the first to fourth modification examples (see FIGS. 12 to 15), a structure in which the n+ type inner cathode region 81 and the n+ type outer cathode region 82 are integrated may be adopted.

For example, the n+ type inner cathode region 81 may include a spiral line-shaped pattern portion 85 continuously drawn around from the n+ type outer cathode region 82 toward the central region of the device formation region 6.

The n+ type inner cathode region 81 may include a comb-shaped line-shaped pattern portion 85 continuously drawn around from the n+ type outer cathode region 82 toward the central region of the device formation region 6.

Figure 17:
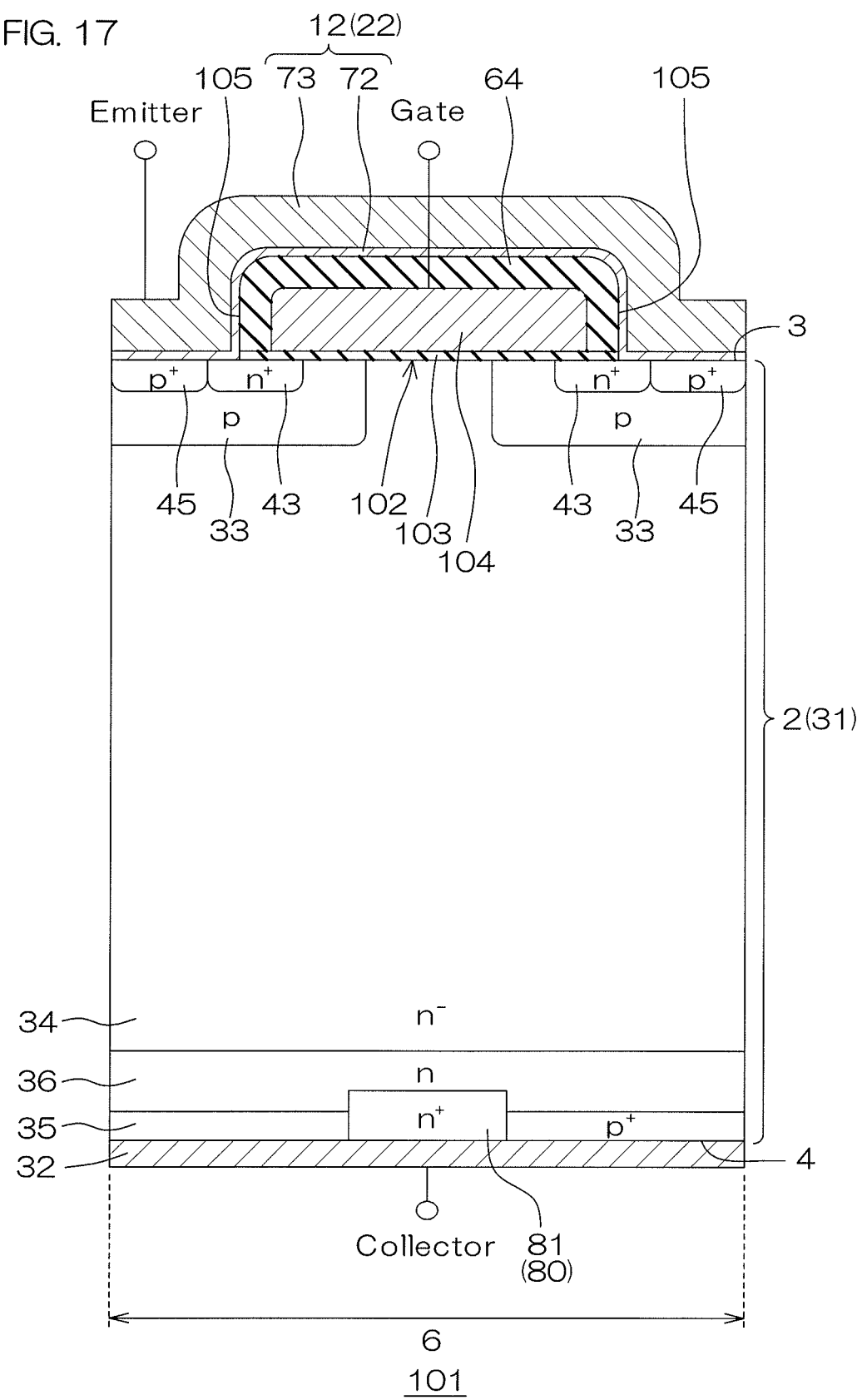
FIG. 17 is a schematic sectional view of a semiconductor device according to a second preferred embodiment.

FIG. 17 is a schematic sectional view of a semiconductor device 101 according to a second preferred embodiment. Hereinafter, structures corresponding to the structures described for the semiconductor device 1 will be provided with the same reference symbols and description thereof will be omitted.

The semiconductor device 1 has the trench gate type IGBT. Meanwhile, the semiconductor device 101 has a planar gate type IGBT. The semiconductor device 101 includes a semiconductor layer 2. P type channel regions 33 are formed to be spaced from each other in a surface layer portion of a first principal surface 3 of the semiconductor layer 2.

In a surface layer portion of each of the p type channel regions 33, an n+ type emitter region 43 and a p+ type contact region 45 are formed to be spaced from a peripheral edge of the p type channel region 33 to the inside. In a surface layer portion of a second principal surface 4 of the semiconductor layer 2, an n type buffer region 36, a p+ type collector region 35, and an n+ type cathode region 80 are formed. In the semiconductor layer 2, a region between the p type channel region 33 and the n type buffer region 36 is the n− type drift region 34 described above.

In a device formation region 6, a planar gate structure 102 is formed on the first principal surface 3 of the semiconductor layer 2. The planar gate structure 102 includes a gate insulating film 103 and a gate electrode 104.

The gate electrode 104 faces the n+ type emitter region 43, the p type channel regions 33, and the n− type drift region 34 across the gate insulating film 103. The planar gate structure 102 is covered with the insulating layer 64 described above. In this embodiment, the device formation region 6 is defined by a region surrounded by a p+ type terminal region 51.

A contact hole 105 from which the p type channel regions 33 and the n+ type emitter region 43 are exposed is formed in the insulating layer 64. The emitter electrode 12 comes into the contact hole 105 from above the insulating layer 64.

The emitter electrode 12 is electrically connected to the p type channel regions 33 and the n+ type emitter region 43 in the contact hole 105. A collector electrode 32 is formed on the second principal surface 4 side of the semiconductor layer 2. The collector electrode 32 is electrically connected to the p+ type collector region 35 and the n+ type cathode region 80.

As described above, with the semiconductor device 101, the operations and the effects which are similar to the operations and the effects described for the semiconductor device 1 can also be exerted. The structure of the semiconductor device 101 may be assembled into the first preferred embodiment and each of the modification examples. That is, in the first preferred embodiment and each of the modification examples, in place of, or in addition to the trench gate type IGBT, the planar gate type IGBT may be formed in the device formation region 6.

Although the preferred embodiments of the present invention are described above, the present invention can further be implemented in other modes.

For example, in each of the preferred embodiments described above and each of the modification examples described above, the semiconductor layer 2 may include, in place of the n− type semiconductor substrate 31, a p type semiconductor substrate and an n− type epitaxial layer formed on the p type semiconductor substrate.

Both the p type semiconductor substrate and the n type epitaxial layer may be made of silicon. The n− type epitaxial layer is formed by epitaxial growth of silicon on a principal surface of the p type semiconductor substrate.

In this case, the p type semiconductor substrate corresponds to the p+ type collector region 35. The n− type epitaxial layer corresponds to the n− type drift region 34. The n+ type inner cathode region 81 and the n+ type outer cathode region 82 are formed by implanting n type impurities to the p type semiconductor substrate (p+ type collector region 35).

In each of the preferred embodiments described above and each of the modification examples described above, the gate electrode 11 may be formed in a region other than the central region of the side surface 5a. In this case, the gate electrode 11 may be formed along a corner portion connecting arbitrary two side surfaces among the side surfaces 5a, 5b, 5c, 5d in the plan view.

In each of the preferred embodiments described above and each of the modification examples described above, the pair of open ends 18, 19 of the gate finger 17 may be formed along a region other than the side surface 5b. In this case, the pair of open ends 18, 19 of the gate finger 17 may be formed along a corner portion positioned opposing the corner portion where the gate electrode 11 is arranged.

In each of the preferred embodiments described above and each of the modification examples described above, a structure where no p+ type terminal region 51 is provided may be adopted. In this case, the outer free wheeling diode Do includes the pn junction portion formed in the region between the p type channel region 33 and the n− type drift region 34. The outer free wheeling diode Do includes the n+ type outer cathode region 82 as the cathode and the p type channel region 33 as the anode.

In each of the preferred embodiments described above and each of the modification examples described above, a structure where no emitter routing portion 23 and no emitter connecting portion 24 are provided may be adopted. In this case, the anode electrode of the outer free wheeling diode Do is formed by the emitter pad 22. The cathode electrode of the outer free wheeling diode Do is formed by the collector electrode 32 connected to the n+ type outer cathode region 82.

In each of the preferred embodiments described above and each of the modification examples described above, the n+ type inner cathode region 81 may be formed in a stripe shape in the plan view. In each of the preferred embodiments described above and each of the modification examples described above, the n+ type inner cathode region 81 may be formed in a grid shape in the plan view.

In each of the preferred embodiments described above and each of the modification examples described above, the free space region 83 may be set in a region outside the region overlapping the gate pad 16 in the plan view.

In each of the preferred embodiments described above and each of the modification examples described above, the free space region 83 may be not overlapping the gate pad 16 in the plan view.

In each of the preferred embodiments described above and each of the modification examples described above, a structure where no free space region 83 is provided may be adopted.

In each of the preferred embodiments described above and each of the modification examples described above, the n+ type inner cathode region 81 may be formed in a region overlapping the gate pad 16 in the plan view.

In each of the preferred embodiments described above and each of the modification examples described above, the n+ type inner cathode region 81 may include line-shaped pattern portions 85 in uniform arrangement (symmetric with respect to a line and to a point) in the plan view in the device formation region 6.

In each of the preferred embodiments described above and each of the modification examples described above, the n+ type inner cathode region 81 may include dot-shaped pattern portions 95 in uniform arrangement (symmetric with respect to a line and to a point) in the plan view in the device formation region 6.

In each of the preferred embodiments described above and each of the modification examples described above, at least a part of the n+ type outer cathode region 82 may be formed in the withstand voltage retention region 8. In this case, at least a part of the n+ type outer cathode region 82 may face the p+ type field limit regions 52.

In each of the preferred embodiments described above and each of the modification examples described above, all of the n+ type outer cathode region 82 may be formed in a withstand voltage retention region 8. In this case, at least a part of or all of the n+ type outer cathode region 82 may face the p+ type field limit regions 52.

In each of the preferred embodiments described above and each of the modification examples described above, at least a part of the n+ type outer cathode region 82 may be formed in the scribe region 9. In this case, at least a part of the n+ type outer cathode region 82 may face the n+ type channel stop region 53.

In each of the preferred embodiments described above and each of the modification examples described above, all of the n+ type outer cathode region 82 may be formed in the scribe region 9. In this case, at least a part of or all of the n+ type outer cathode region 82 may face the n+ type channel stop region 53.

In each of the preferred embodiments described above and each of the modification examples described above, an arrangement in which the conductivity types of the respective semiconductor portions are inverted may be adopted. That is, a p type portion may be of an n type and an n type portion may be of a p type.

The present application corresponds to Japanese Patent Application No. 2017-012264 filed in the Japan Patent Office on Jan. 26, 2017, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

What is claimed is:

1. A semiconductor device comprising:
    a semiconductor layer of a first conductivity type having a first principal surface on one side and a second principal surface on the other side, the semiconductor layer having a device formation region and an outer region outside the device formation region;
    a channel region of a second conductivity type formed in a surface layer portion of the first principal surface of the semiconductor layer in the device formation region;
    an emitter region of the first conductivity type formed in a surface layer portion of the channel region;
    an embedded gate electrode formed at the first principal surface of the semiconductor layer in the device formation region, the gate electrode facing the channel region across a gate insulating film;
    a drift region of the first conductivity type formed in the outer region;
    a collector region of the second conductivity type formed in a surface layer portion of the second principal surface of the semiconductor layer in the device formation region;
    an inner cathode region of the first conductivity type formed in the surface layer portion of the second principal surface of the semiconductor layer in the device formation region;
    an outer cathode region of the first conductivity type formed in the surface layer portion of the second principal surface of the semiconductor layer in the outer region;
    a gate pad formed on the first principal surface of the semiconductor layer,
        wherein the gate pad overlaps with a portion of the device formation region and a portion of the outer region,
        the gate pad extends from the outer region to the device formation region, and
        the gate pad is electrically connected to the embedded gate electrode;
    an IGBT (Insulated Gate Bipolar Transistor) channel structure formed by the embedded gate electrode, the emitter region of the first conductivity type, the channel region of the second conductivity type, and the drift region of the first conductivity type; and
    a dummy channel structure, formed in the device formation region and the outer region, the dummy channel structure being formed by the embedded gate electrode, the channel region of the second conductivity type, and the drift region of the first conductivity type,
        wherein the outer cathode region of the first conductivity type is not formed in a region immediately below the dummy channel structure.

2. The semiconductor device according to claim 1, further comprising:
    an emitter electrode connected to the emitter region on the first principal surface of the semiconductor layer; and
    a collector electrode connected to the collector region, the inner cathode region, and the outer cathode region on the second principal surface of the semiconductor layer.

3. The semiconductor device according to claim 2, further comprising:
    an inner diode having the emitter electrode serving as an anode electrode and the collector electrode connected to the inner cathode region in the device formation region serving as a cathode electrode; and
    an outer diode having the emitter electrode serving as the anode electrode and the collector electrode connected to the outer cathode region in the outer region serving as the cathode electrode.

4. The semiconductor device according to claim 1, further comprising:
    a terminal region of the second conductivity type formed in the surface layer portion of the first principal surface of the semiconductor layer along the channel region in the outer region.

5. The semiconductor device according to claim 4, further comprising:
    an inner diode having the channel region serving as an anode and the inner cathode region serving as a cathode; and
    an outer diode having the terminal region serving as the anode and the outer cathode region serving as the cathode.

6. The semiconductor device according to claim 4, wherein the outer cathode region faces the terminal region across a region of the semiconductor layer.

7. The semiconductor device according to claim 4, wherein a bottom portion of the terminal region is positioned in the second principal surface side of the semiconductor layer with respect to a bottom portion of the channel region.

8. The semiconductor device according to claim 4, wherein the terminal region has a second conductivity type impurity concentration higher than a second conductivity type impurity concentration of the channel region.

9. The semiconductor device according to claim 4,
    wherein the outer region surrounds the device formation region in a plan view as viewed from a normal direction of the first principal surface of the semiconductor layer, and
    the terminal region surrounds the channel region in the plan view as viewed from the normal direction of the first principal surface of the semiconductor layer.

10. The semiconductor device according to claim 1,
wherein the collector region is also formed in the surface layer portion of the second principal surface of the semiconductor layer in the outer region, and
the outer cathode region passes through the collector region.

11. The semiconductor device according to claim 1, wherein the outer cathode region includes a pattern extending along a periphery of the device formation region.

12. The semiconductor device according to claim 1, wherein the outer cathode region includes a pattern whose portions are spaced from each other along a periphery of the device formation region.

13. The semiconductor device according to claim 1, wherein the outer cathode region includes a first pattern extending along a periphery of the device formation region, and a second pattern whose portions are spaced from each other along the periphery of the device formation region.

14. The semiconductor device according to claim 1, wherein the inner cathode region passes through the collector region.

15. The semiconductor device according to claim 1, wherein the inner cathode region includes a continuously extending pattern.

16. The semiconductor device according to claim 1, wherein the inner cathode region includes a pattern whose portions are spaced from each other.

17. The semiconductor device according to claim 1, wherein the outer cathode region has a depth equal to a depth of the inner cathode region.

18. The semiconductor device according to claim 1, wherein the outer cathode region first conductivity type impurity concentration is equal to the inner cathode region first conductivity type impurity concentration.

19. The semiconductor device according to claim 1, wherein when a forward voltage of 1.6 V is applied between the emitter region and the collector region in a state where a voltage of 15 V is applied between the emitter region and the gate electrode, a forward current flowing between the emitter region and the collector region is not less than 2 A.

20. The semiconductor device according to claim 1, wherein when a forward voltage of 2 V is applied between the emitter region and the collector region in a state where a voltage of 15 V is applied between the emitter region and the gate electrode, a forward current flowing between the emitter region and the collector region is not less than 8 A.

21. The semiconductor device according to claim 1, wherein when a forward voltage of 3 V is applied between the emitter region and the collector region in a state where a voltage of 15 V is applied between the emitter region and the gate electrode, a forward current flowing between the emitter region and the collector region is not less than 20 A.

22. A semiconductor device comprising:
a semiconductor layer of a first conductivity type having a first principal surface on one side and a second principal surface on the other side;
a channel region of a second conductivity type formed in a surface layer portion of the first principal surface of the semiconductor layer;
an emitter region of the first conductivity type formed in a surface layer portion of the channel region;
an embedded gate electrode formed at the first principal surface of the semiconductor layer, the gate electrode facing the channel region across a gate insulating film;
a drift region of the first conductivity type formed in the outer region;
a collector region of the second conductivity type formed in a facing region facing the channel region in a surface layer portion of the second principal surface of the semiconductor layer;
an inner cathode region of the first conductivity type formed in the facing region in the surface layer portion of the second principal surface of the semiconductor layer;
an outer cathode region of the first conductivity type formed in a non-facing region which is a region outside the facing region in the surface layer portion of the second principal surface of the semiconductor layer;
a gate pad formed on the first principal surface of the semiconductor layer, wherein
the gate pad is electrically connected to the embedded gate electrode;
an IGBT (Insulated Gate Bipolar Transistor) channel structure formed by the embedded gate electrode, the emitter region of the first conductivity type, the channel region of the second conductivity type, and the drift region of the first conductivity type; and
a dummy channel structure, formed in the device formation region and the outer region, the dummy channel structure being formed by the embedded gate electrode, the channel region of the second conductivity type, and the drift region of the first conductivity type,
wherein the outer cathode region of the first conductivity type is not formed in a region immediately below the dummy channel structure.

23. The semiconductor device according to claim 22, further comprising:
a terminal region of the second conductivity type formed in the surface layer portion of the first principal surface of the semiconductor layer along the channel region, wherein the outer cathode region faces the terminal region across a region of the semiconductor layer.

* * * * *